(12) United States Patent
Kinoshita et al.

(10) Patent No.: US 6,204,542 B1
(45) Date of Patent: Mar. 20, 2001

(54) FIELD EFFECT TRANSISTOR WITH IMPROVED DRIVING CAPABILITY

(75) Inventors: Eita Kinoshita; Yoshitaka Kimura; Shigeo Iida, all of Tochigi (JP)

(73) Assignee: Kawasaki Steel Corporation, Hyogo (JP)

( * ) Notice: Subject to any disclaimer, the term of this patent is extended or adjusted under 35 U.S.C. 154(b) by 0 days.

(21) Appl. No.: 09/161,916

(22) Filed: Sep. 29, 1998

(30) Foreign Application Priority Data

Sep. 29, 1997 (JP) .................................................... 9-264141

(51) Int. Cl.[7] .............................. H01L 27/10; H01L 29/10
(52) U.S. Cl. ........................ 257/401; 257/206; 257/207; 257/208; 257/390; 257/412; 257/387
(58) Field of Search .................................. 257/206, 207, 257/208, 390, 412, 401, 387

(56) References Cited

U.S. PATENT DOCUMENTS

| | | |
|---|---|---|
| 5,289,021 | 2/1994 | El Gamal . |
| 5,355,008 | 10/1994 | Moyer et al. . |
| 5,436,485 | 7/1995 | Shikatani et al. . |
| 5,444,275 | 8/1995 | Kugishima et al. . |
| 5,517,041 | 5/1996 | Torii et al. . |
| 5,539,246 | 7/1996 | Kapoor . |

FOREIGN PATENT DOCUMENTS 9-264141   10/1993   (JP) .

*Primary Examiner*—Fetsum Abraham
(74) *Attorney, Agent, or Firm*—Oliff & Berridge PLC

(57) ABSTRACT

The gate width of a field effect transistor is increased to a value greater than a size of an active region by forming an inclined portion of a gate electrode. As a result, the current driving capability of a field effect transistor is increased without degrading the integration density. The driving capability of the transistor can be further effectively increased by forming an expanded portion of the active region at a location corresponding to the inclined portion of the gate electrode thereby reducing the resistance of the diffusion layer.

36 Claims, 9 Drawing Sheets

FIELD EFFECT TRANSISTOR WITH IMPROVED DRIVING CAPABILITY

BACKGROUND OF THE INVENTION

1. Field of the Invention

The invention relates to a semiconductor device for use in a semiconductor integrated circuit, and more particularly, to a field effect transistor whose current driving capability is improved without causing a reduction in the integration density, and also to a method of increasing the current driving capability of a field effect transistor. The invention also relate to a basic cell including a field effect transistor with improved current driving capability. Furthermore, the invention relates to a method of designing a mask layout for such a transistor or basic cell.

2. Description of the Related Art

FIG. 1 is a plan view illustrating a layout of a conventional MOSFET (metal oxide semiconductor field effect transistor). In FIG. 1, reference numeral 14 denotes an active region formed in the surface of a semiconductor substrate. A gate electrode 13 is formed over the active region via a gate insulating film. A channel region of the transistor is formed in the portion of the active region under the gate electrode. In other words, the portion of the gate electrode 13 overlapping, or located over, the active region 14 serves to define the channel region. Diffusion regions containing an impurity providing a desired type of conduction are formed in the active region on both sides of the channel region. One of these diffusion regions is called a drain region 11 and the other a source region 12. An isolation region 16 is formed around the active region. In FIG. 1, contact holes are formed at square-shaped regions 15. In the embodiment shown in FIG. 1, there are three contact holes: a contact hole D used for contacting to the drain region; a contact hole S used for contacting to the source region; and a contact hole G used for contacting to the gate electrode.

In the transistor according to the embodiment described above, if a proper voltage is applied between the gate electrode and the substrate, a channel is formed in the channel region. In other words, the portion of the gate electrode located over the active region serves as an intrinsic gate, that is, serves to form the channel. If a proper voltage is further applied between the drain and the source, then current flows between the drain and the source. The current driving capability of the transistor is defined by the current that flows when voltages specified depending on the conditions required in a particular application are applied to the gate, source, and drain, respectively. A transistor having higher current driving capability can operate at a higher speed.

A typical process for producing such a field effect transistor is described below. First, isolation regions are formed in the principal surface of a semiconductor substrate by various methods, including the LOCOS (local oxidation of silicon) method, the trench isolation method, or the like. Regions surrounded by the isolation regions will become the active regions in which transistors or other elements are formed. In the case where a CMOS (complementary metal-oxide-silicon) integrated circuit is produced, p-wells and/or n-wells are also formed in the principal surface of the semiconductor substrate. Subsequently, a gate insulating film is formed on the surface of the active region. Furthermore, for example, a polycrystalline silicon film is deposited on the gate insulating film. The polycrystalline silicon film is patterned into the form of a gate electrode. Diffusion regions are then formed in the active region, at both sides of the gate electrode, thereby forming a source region and a drain region. More specifically, the diffusion regions of the source and drain regions are formed, for example, by implanting an impurity of a proper conduction type into the active region using the gate electrode as an implantation mask so that only the area of the active region which is not covered by the gate electrode is implanted with the impurity. Thus, a MOSFET is obtained.

Furthermore, additional source and drain regions may also be formed as follows. After performing ion implantation using the gate electrode as the mask, a gate side wall film with a particular thickness is formed on each side wall of the gate electrode. Ion implantation is again performed at a different energy and to a different concentration, thereby forming source and drain regions below the gate side wall films and on the outside thereof with different depths and impurity concentrations. For example, the impurity concentration in the areas below the gate side wall films is set lower than that of the outer regions so as to reduce the electric field at the drain edge thereby suppressing generation of hot carriers. This type of MOSFET is called an LDD (lightly doped drain) MOSFET. In the example shown in FIG. 1, gate side wall films 18 are formed on the sides of the gate electrode 13.

Furthermore, the transistor formed according to the process described above is covered with an insulating film. Holes are then formed in the insulating film at proper locations so as to form contact holes for connections to the gate, source, and drain, respectively. After forming a plug in each contact hole, interconnections are formed on the insulating film whereby the transistor is connected to other transistors or elements.

The length of the channel region, that is, the spacing between the source and drain is generally called a channel length. The channel length is determined by the gate length, that is the lateral size, i.e., L in FIG. 1, of the part of the gate electrode over the active region. For this reason, the gate electrode is formed so that it has a fixed width over the active region. On the other hand, the contact to the gate electrode is made in a portion of the gate electrode that extends over the isolation region and has a greater width. The width of the channel region, that is, the length measured along the boundary between the channel region and the source or the drain is called a channel width. The channel width is determined by the gate width, that is, the longitudinal size, i.e., W in FIG. 1, of the part of the gate electrode located over the active region. The current driving capability of the transistor increases with the reduction in the gate length and with the increase in the gate width. However, the minimum gate length is limited by the process technology. Thus, to produce a transistor with a high current driving capability, it is required to increase the gate width, that is, the length, i.e., longitudinal size, of the part of the gate electrode located over the active region.

In semiconductor integrated circuits, a large number of such transistors are formed on the surface of a semiconductor substrate, and they are connected to one another via contacts. In most cases, a plurality of transistors, for example two transistors, are formed in one active region, although one transistor is formed in the active regions shown in FIG. 1. It is also well known in the art to dispose basic cells, each of which includes a particular number of transistors, into an array form so as to form a cell array and then properly connect the transistors in the cell array thereby forming a desired circuit. In this technique, it is also known to form contacts at grid points disposed at fixed intervals so as to achieve more efficient connections.

FIG. 2 illustrates an example of a basic cell, as disclosed in FIG. 10 of U.S. Pat. No. 5,436,485, which includes two n-channel transistors and two p-channel transistors. In this basic cell, contact holes may be formed at any contact areas at uniformly spaced grid points in an X–Y plane. In FIG. 2, contact areas are denoted by squares. Specifically, three contact areas are arranged on each line in the X direction and ten contact areas are arranged in each line in the Y direction. Thus, a total of thirty contact areas 97, 106–111, 115, 124–129, are provided wherein a contact may be formed in any desired contact area. In this basic cell, active regions 194 and 212 are each formed into a rectangular shape whose sides are parallel to the X or Y direction. Gate electrodes 98, 99, 116, and 117 are formed in such a manner that their portions 100, 103, 118, and 121 located over the active region 194 or 212 have a straight-line shape having a fixed width and extending in the Y direction. Each gate electrode has rectangular portions 101 and 102, 104 and 105, 119 and 120, or 122 and 123 which are formed above the isolation region and which have a width greater than the width of the portions located over the active region 194 or 212. Contact areas are formed in the rectangular portions above the isolation region.

In the examples shown in FIGS. 1 and 2, because the gate electrode(s) is (are) formed in such a manner that the straight-line-shaped portion located over the rectangular-shaped active region extends in a direction parallel to a side of the active region, the gate width is determined by the size of the active region. Therefore, if the size of the active region is reduced to increase the integration density, a corresponding reduction occurs in the gate width. The reduction in the gate width results in a reduction in the current driving capability of the transistor. This means that it is difficult to simultaneously achieve both a high integration density and a high current driving capability.

SUMMARY OF THE INVENTION

In view of the aforementioned problems in the conventional technology, an object of the invention is to provide a field effect transistor with increased gate width without degrading integration density. A further object of the invention is to provide a field effect transistor with increased current driving capability.

Another object of the invention is to provide a method for increasing the current driving capability of a field effect transistor.

Another object of the invention is to provide a basic cell, including a field effect transistor, with increased gate width. A further object of the invention is to provide a basic cell, including a field effect transistor, with increased current driving capability.

Still another object of the invention is to provide a method of designing a basic cell, including a transistor with increased gate width. A further object of the invention is to provide a method of designing a basic cell including a transistor with increased current driving capability.

According to one aspect of the invention, there is provided a semiconductor device which includes a semiconductor substrate having a surface; an isolation region in the surface of the semiconductor substrate; an active region in the surface of the semiconductor substrate surrounded by the isolation region, the active region having a perimeter and including a main portion having a substantially straight main edge and expanded portion attached to a part of the main edge of the main portion; a gate electrode including a main electrode portion, a contact portion and an inclined portion between the main electrode portion and the contact portion, the main electrode portion and the inclined portion being disposed at least partially over the main portion of the active region, the contact portion being disposed at least partially on the isolation region, the inclined portion having an edge and being inclined relative to the main electrode portion, the edge of the inclined portion of the gate electrode and a boundary between the main portion and the expanded portion of the active region making a first angle that is substantially less than 90°, wherein the expanded portion of the active region increases a distance from the edge of the inclined portion of the gate electrode to the perimeter of the active region.

According to an embodiment of the invention, the edge of the inclined portion of the gate electrode extends to at least an adjacent position over the boundary between the expanded portion and the main portion of the active region.

Also, according to an embodiment of the invention, the main portion of the active region also has an additional main edge that is substantially parallel to the main edge; and the main electrode portion of the gate electrode extends to at least a position over the additional main edge of the main portion of the active region.

According to an embodiment of the invention, the main portion of the active region has an additional main edge that is substantially parallel to the main edge; the active region further includes an additional expanded portion attached to a part of the additional main edge of the main portion; the gate electrode further includes an additional inclined portion having an edge, the additional inclined portion is disposed at least partially over the main portion of the active region, the edge of the additional inclined portion and a boundary between the main portion and the additional expanded portion of the active region make a second angle that is substantially less than 90°; and the additional expanded portion of the active region increases a distance from the edge of the additional inclined portion of the gate electrode to the perimeter of the active region.

According to another aspect of the invention, a method of forming a semiconductor device which provides increased driving capability. The method includes the steps of forming an active region surrounded by an isolation region in a surface of a semiconductor substrate, the active region having a perimeter and including a main portion having a substantially straight main edge and an expanded portion attached to a part of the main edge of the main portion; and forming a gate electrode including a main electrode portion, a contact portion and an inclined portion between the main electrode portion and the contact portion, the main electrode portion and the inclined portion being disposed at least partially over the main portion of the active region, the contact portion being disposed at least partially over the isolation region, the inclined portion having an edge and being inclined relative to the main electrode portion, the edge of the inclined portion of the gate electrode and a boundary between the main portion and the expanded portion of the active region making a first angle that is substantially less than 90°, wherein the expanded portion of the active region increases a distance from the edge of the inclined portion of the gate electrode to the perimeter of the active region.

According to an aspect of the invention, a semiconductor device is provided which includes a semiconductor substrate having a surface; an active region having a perimeter formed in the surface of the semiconductor substrate, the active region including a main portion having a substantially straight main edge and an expanded portion attached to a part of the main edge of the main portion; and a gate electrode including an inclined portion having an edge, the inclined portion being disposed at least partially over the main portion of the active region, the edge of the inclined portion and a boundary between the main portion and the expanded portion of the active region making a first angle that is substantially less than 90°, wherein the expanded portion of the active region increases a distance from the edge of the inclined portion of the gate electrode to the perimeter of the active region.

According to an embodiment of the invention, the edge of the inclined portion of the gate electrode extends to at least an adjacent position over the boundary between the expanded portion and the main portion of the active region.

Also, according to an embodiment of the invention, the main portion of the active region also has an additional main edge that is substantially parallel to the main edge; the active region further includes an additional expanded portion attached to a part of the additional main edge of the main portion; the gate electrode further includes an additional inclined portion and a main electrode portion between the inclined portion and the additional inclined portion, the additional inclined portion and the main electrode portion of the gate electrode are disposed at least partially over the main portion of the active region, the inclined portion and the additional inclined portion are inclined relative to the main portion, an edge of the additional inclined portion and a boundary between the main portion and the additional expanded portion of the active region make a second angle that is substantially less than 90°; and the additional expanded portion of the active region increases a distance from the edge of the additional inclined portion of the gate electrode to the perimeter of the active region.

According to another aspect of the invention, a method of forming a semiconductor device which provides increased driving capability is provided, which includes the steps of forming an active region having a perimeter in a surface of a semiconductor substrate, the active region including a main portion having a substantially straight main edge and an expanded portion attached to a part of the main edge of the main portion; forming a gate electrode including an inclined portion having an edge, the inclined portion disposed at least partially over the main portion of the active region, the edge of the inclined portion and a boundary between the main portion and the expanded portion of the active region making a first angle that is substantially less than 90°; wherein the expanded portion of the active region increases a distance from the edge of the inclined portion of the gate electrode to the perimeter of the active region.

According to an aspect of the invention, a semiconductor device is provided which includes a semiconductor substrate having a surface; an active region formed in the surface of the semiconductor substrate, the active region including a main portion having a substantially straight main edge and an expanded portion attached to a part of the main edge of the main portion; and a gate electrode including an inclined portion having an edge, the inclined portion disposed at least partially over the main portion of the active region, the edge of the inclined portion of the gate electrode and the boundary between the main portion and the expanded portion of the active region making a first angle that is substantially less than 90°; wherein the active region includes a channel region below the inclined portion of the gate electrode and a diffusion region on a side of the edge of the inclined portion of the gate electrode, and wherein the diffusion region expands to the expanded portion of the active region so that a resistance of the diffusion region to the channel region is substantially decreased.

According to another aspect of the invention, a method of forming a semiconductor device which provides increased driving capability is provided, which includes the steps of forming an active region in a surface of a semiconductor substrate, the active region including a main portion having a substantially straight main edge and an expanded portion attached to a part of the main edge of the main portion; forming a gate electrode including an inclined portion having an edge, the inclined portion disposed at least partially over the main portion of the active region so that a channel region is formed in the active region below the inclined portion of the gate electrode, the edge of the inclined portion of the gate electrode and the boundary between the main portion and the expanded portion of the active region making a first angle that is substantially less than 90°; and forming a diffusion region in the active region on a side of the edge of the inclined portion of the gate electrode, the diffusion region expanding to the expanded portion of the active region so that a resistance of the diffusion region to the channel region is substantially decreased.

According to an aspect of the invention, a semiconductor device is provided which includes a semiconductor substrate having a surface; an isolation region in the surface of the semiconductor substrate; an active region in the surface of the semiconductor substrate surrounded by the isolation region; a gate electrode including a main electrode portion, a contact portion having a contact area for forming a contact to the gate electrode, and a connecting portion for connecting the contact portion to the main electrode portion, the main electrode portion and the connecting portion being disposed at least partially over the active region, the contact portion being disposed at least partially on the isolation region, the connecting portion being inclined relative to the main electrode portion, wherein the active region includes contact areas for forming contacts to the active region on both sides of the main electrode portion of the gate electrode, the contact areas of the active region are aligned in a first direction with a first space; and one of the contact areas of the active region and the contact area of the gate electrode are aligned in a second direction perpendicular to the first direction with a second space.

According to an aspect of the invention, a semiconductor device is provided which includes a semiconductor substrate having a surface; an isolation region in the surface of the semiconductor substrate; an active region in the surface of the semiconductor substrate surrounded by the isolation region, the active region having a perimeter and including a main portion having a substantially straight main edge and an expanded portion attached to the main edge of the main portion; a gate electrode including a main electrode portion, a contact portion having a contact area for forming a contact to the gate electrode, and a connecting portion for connecting the contact portion to the main electrode portion, the main electrode portion and the connecting portion being disposed at least partially over the main portion of the active region, the contact portion being disposed at least partially over the isolation region, the connecting portion having an edge, the connecting portion being inclined relative to the main portion, the edge of the connecting portion of the gate electrode and a boundary between the main portion and the expanded portion of the active region making a first angle that is substantially less than 90°, wherein the active region has contact areas for forming contacts to the active region on both sides of the main electrode portion of the gate electrode, the contact areas of the active region are aligned in a first direction with a first space; one of the contact areas of the active region and the contact area of the gate electrode are aligned in a second direction perpendicular to the first direction with a second space; and the expanded portion of the active region increases a distance from the edge of the inclined portion of the gate electrode to a perimeter of the active region.

According to another aspect of the invention, a method of designing a layout of a semiconductor device is provided which includes the steps of placing an active region surrounded by an isolation region; and placing a gate electrode including a main electrode portion, a contact portion having a contact area for forming a contact to the gate electrode, and a connecting portion for connecting the contact portion to the main electrode portion, the main electrode portion and the inclined portion being disposed at least partially over the active region, the contact portion being disposed at least partially over the isolation region, the connecting portion being inclined relative to the main electrode portion, wherein the active region has contact areas for forming contacts to the active region on both sides of the main electrode portion of the gate electrode, the contact areas of the active region are aligned in a first direction with a first space; and one of the contact areas of the active region and the contact area of the gate electrode are aligned in a second direction perpendicular to the first direction with a second space.

According to an aspect of the invention, a semiconductor integrated circuit is provided which includes an array of basic cells arranged in a first and a second direction that are perpendicular with each other, each of the basic cells includes a semiconductor substrate having a surface; an isolation region in the surface of the semiconductor substrate; an active region in the surface of the semiconductor substrate surrounded by the isolation region; a gate electrode including a main electrode portion, a contact portion having a contact area for forming a contact to the gate electrode, and a connecting portion for connecting the contact portion to the main electrode portion, the main electrode portion and the connecting portion being disposed at least partially over the active region, the contact portion being disposed at least partially over the isolation region, the connecting portion being inclined relative to the main electrode portion, wherein the active region has contact areas for forming contacts to the active region on both sides of the main electrode portion of the gate electrode, the contact areas of the active region are aligned in the first direction with a first space; and one of the contact areas of the active region and the contact area of the gate electrode are aligned in the second direction with a second space.

DETAILED DESCRIPTION OF PREFERRED EMBODIMENTS

The invention has been described in Japanese Patent Application No. 9-264141, hereby incorporated by reference.

The invention is now described in detail below with reference to preferred embodiments in conjunction with the accompanying drawings.

Figure 3:
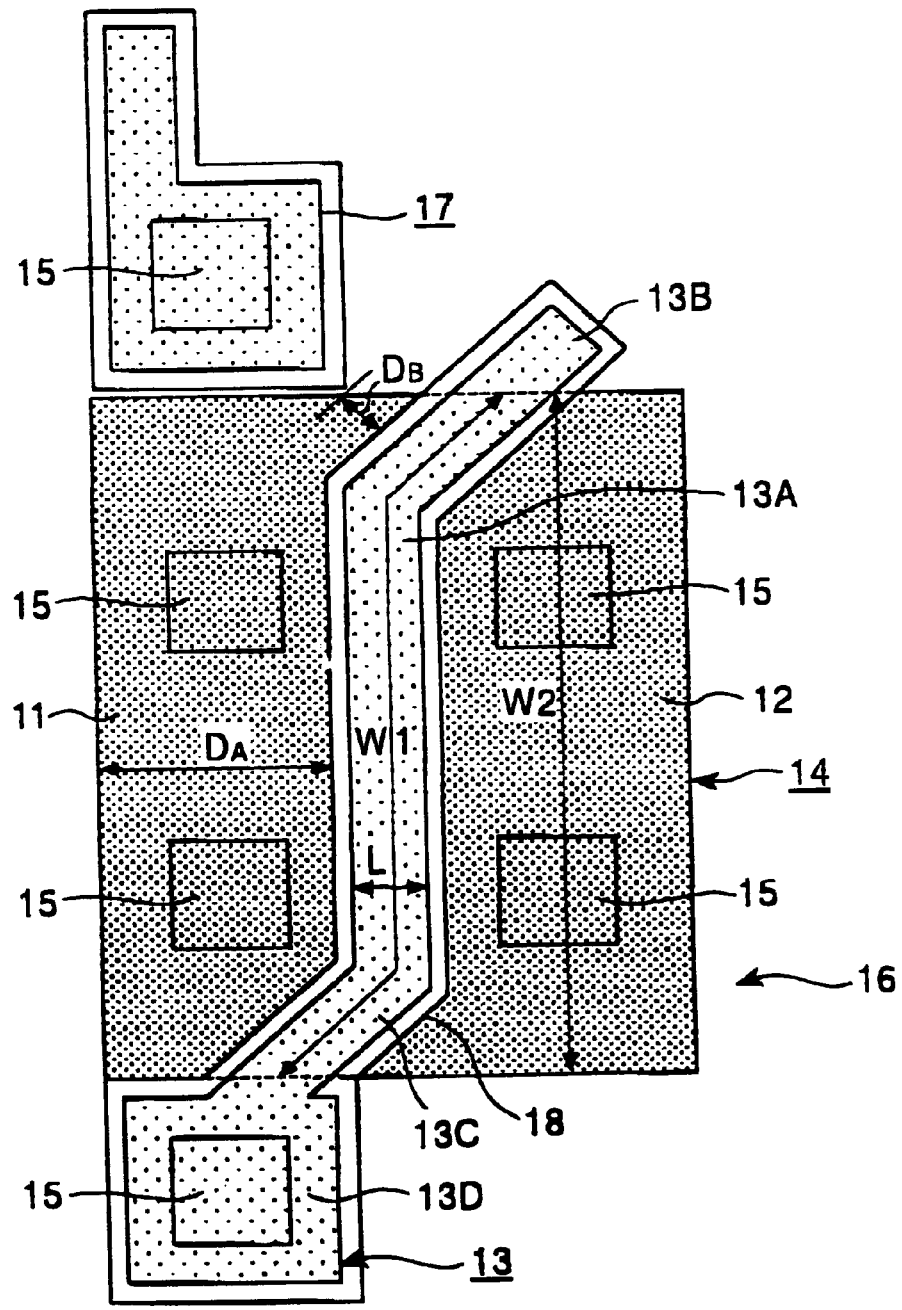
FIG. 3 is a plan view showing the layout of a field effect transistor according to a first embodiment of the invention.

FIG. 3 is a plan view showing the layout of a transistor according to a first embodiment of the invention. This plan view shows the layout of one transistor serving as an element of a semiconductor integrated circuit, including a plurality of transistors.

An active region 14 is formed into a rectangular shape having sides parallel to the X or Y direction. A gate electrode 13 includes a main portion 13A extending in the Y direction, a contact portion 13D with a square shape whose sides are parallel to the X or Y direction, a connecting portion 13C extending from one end of the main portion to the contact portion, thereby connecting the main portion to the contact portion, and an end portion 13B connected to the other end of the main portion. The connecting portion and the end portion are bent into a direction which is not perpendicular to the direction in which the main portion extends. Diffusion regions are formed in the active region 14, at both sides of the gate electrode 13, so that one of the diffusion regions serves as a drain region 11 and the other serves as a source region 12. Side wall films 18 are formed on the side walls of the gate electrode. A low-concentration source region and a low-concentration drain region are formed in the active region, under the respective side wall films 18.

The source region 12 and the drain region 11 each have two contact areas 15 in which contacts to the source region 12 or the drain region 11 may be formed as required. Similarly, a contact area 15 is formed in the contact portion of the gate electrode 13 so that a contact to the gate electrode may be formed in the contact area. In FIG. 3, those contact areas are marked with squares. The contact areas are formed at grid points located at fixed intervals in the X–Y plane. In FIG. 3, two contact areas in the drain region 11 and one contact area of the gate electrode 13 are located at uniformly spaced points aligned in the Y direction in which the main portion of the gate electrode 13 extends. The contact areas in the drain region 11 and the contact areas in the source region 12 are aligned in the X direction. More specifically, the gate length, which is defined by the size of the width of the gate electrode, is, for example, equal to 0.35 $\mu$m, and the bending angle of the connecting portion and the end portion relative to the main portion is selected to be 45°. The distance between the adjacent contact areas is set for example to be 1.7 $\mu$m in both X and Y directions.

The contact areas are regions in which a contact may be formed as required. It is not necessarily required to form a contact in all contact areas. In practice, a contact is formed only in those contact areas which actually need a contact. For example, when an interconnection is formed in a channel over a line passing through the contact areas of a gate electrode of an adjacent transistor, two contact areas in the drain region 11, and the contact area of the gate electrode, if the interconnection is required to be connected to the gate electrode, a contact is formed at the contact area of the gate electrode. If the interconnection is required to be connected to the drain region, a contact is formed at one or both of the contact areas of the drain region. In the case where a plurality of interconnections are formed in the interconnection channel, one of interconnections may be connected to the gate electrode via a contact formed in the contact area of the gate electrode, and another interconnection may be connected to the drain via a contact formed at either one of the contact areas of the drain region. When an interconnection is formed in a channel over a line passing through the contact area of the drain region and the contact area of the source region, if the interconnection is required to be connected to the drain region, a contact is formed at the contact area of the drain region. On the other hand, if the interconnection is required to be connected to the source region, a contact is formed at the contact area of the source.

According to this embodiment, the main portion of the gate electrode 13A of the transistor is formed over the active region 14 so that the main portion serves as an intrinsic gate. The major part of the connecting portion 13C is located over the active region 14, and thus the major part of the connecting portion also serves as an intrinsic gate. The end portion 13B, except for the part extending beyond the edge of the active region 14 over the isolation region 16, is also located over the active region and thus also serves as an intrinsic gate. These parts that serve as the intrinsic gate are formed such that they have a predetermined width which defines the gate length of the transistor. On the other hand, the contact portion 13D of the gate electrode is located over the isolation region 16 and thus it does not serve as an intrinsic gate. Herein, the gate width is defined by the total length of the center line, denoted by an arrow in FIG. 3, extending in the longitudinal direction of three portions, located over the active region 14, of the gate electrode 13. In this embodiment, the gate width of the transistor is given by the total length W1 of the length of the main portion 13A, the length of the part located over the active region of the connecting portion 13C, and the length of the part located over the active region of the end portion 13B. Because the connecting portion 13C and the end portion 13B of the gate electrode are inclined relative to the main portion, W1 becomes greater than the size W2 of the active region as measured in the Y direction. Assume that the size of the active region 14 as measured in the Y direction is 3.9 $\mu$m, the length of the main portion 13A of the gate electrode is 2.8 $\mu$m, and the connecting portion 13C and the end portion 13B are inclined at 45° relative to the main portion 13A. In this case, the sum of the length of the connecting portion and the length of the end portion over the active region becomes about 1.5 $\mu$m. Therefore, the total gate width becomes about 11% greater than the gate width obtained for the structure having only a straight portion that extends in the Y direction.

Figure 1:
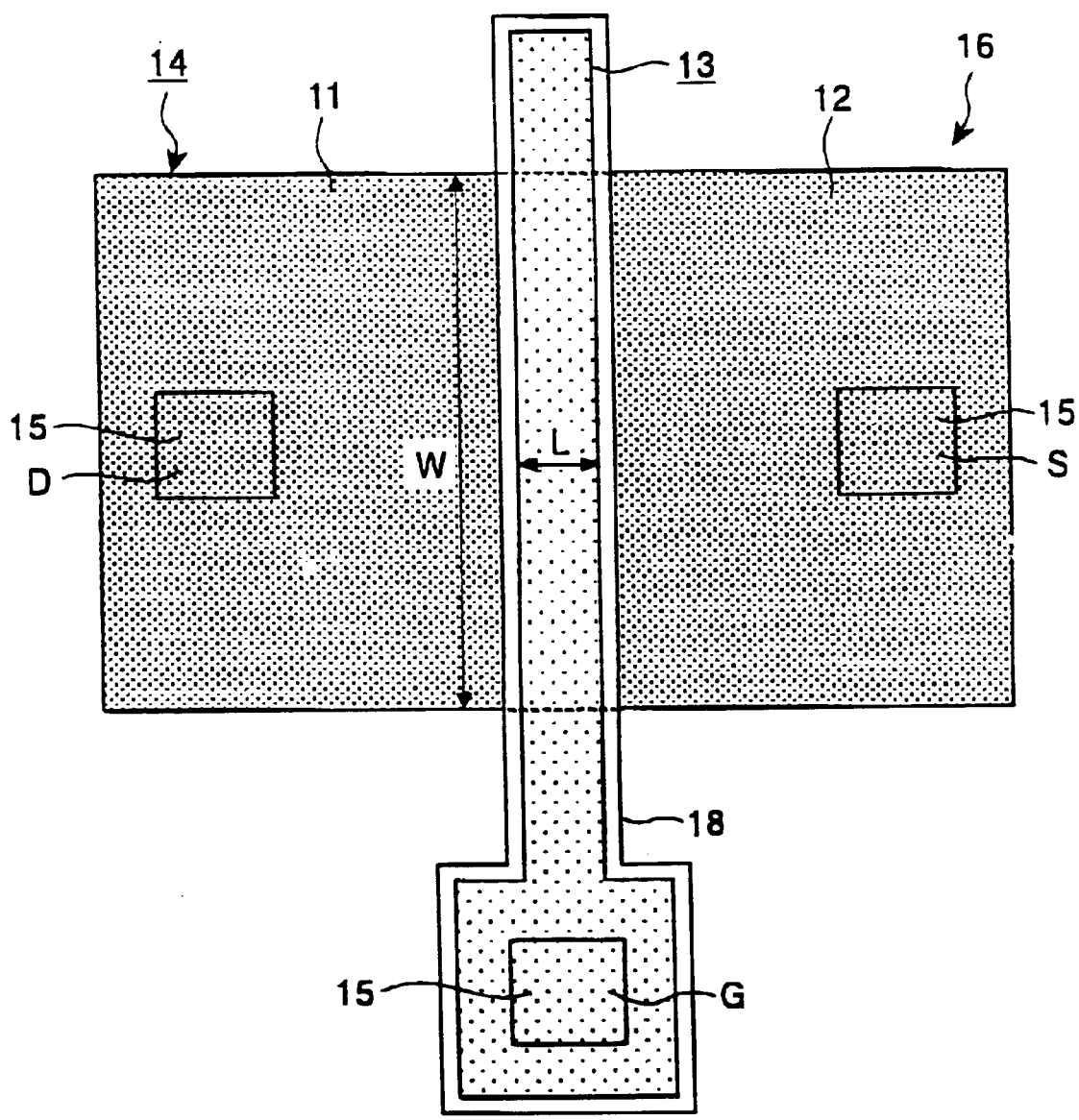
FIG. 1 is a plan view showing an example of the layout of a conventional field effect transistor.
Figure 2:
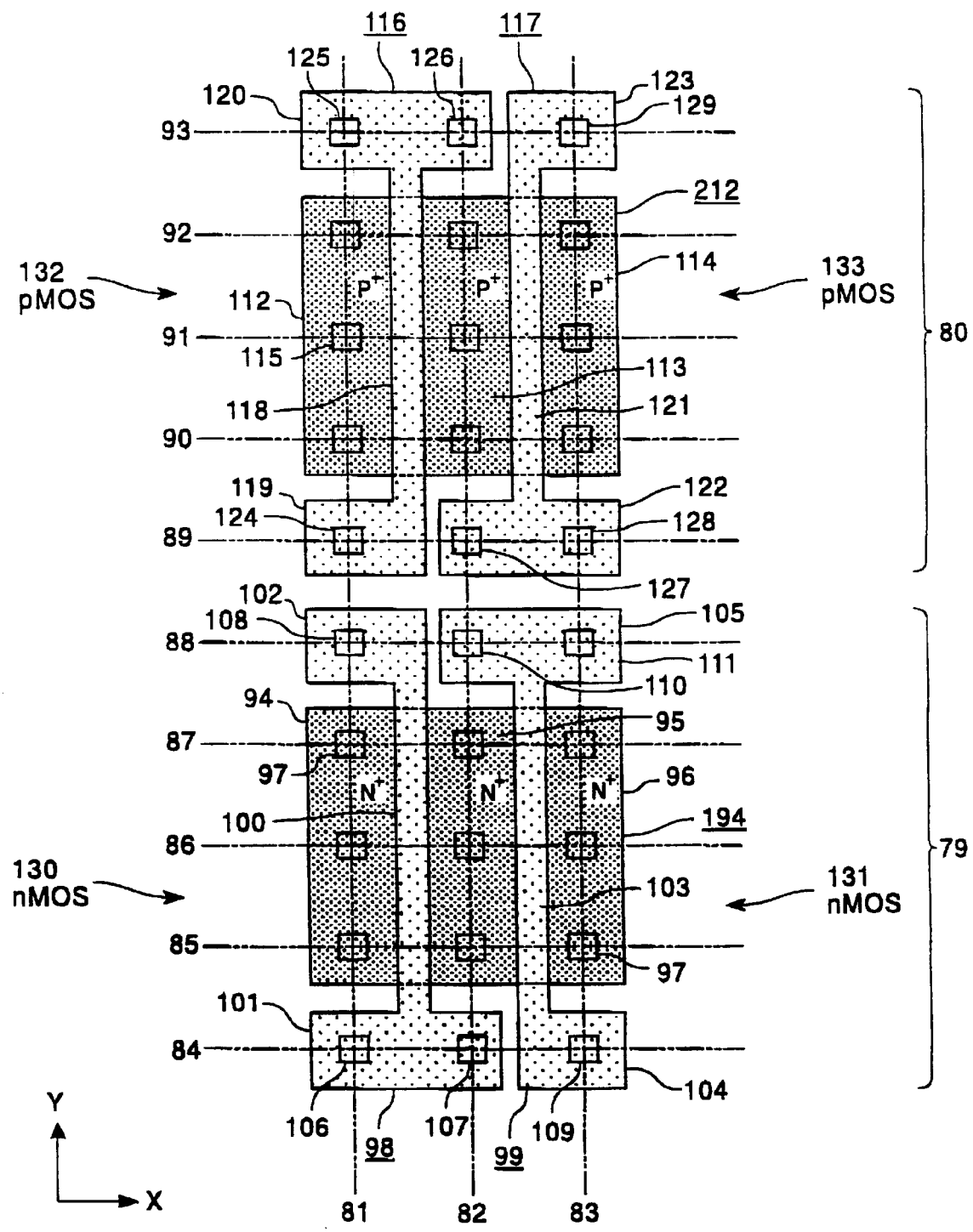
FIG. 2 is a plan view showing an example of the layout of a conventional basic cell including field effect transistors.

Thus, in the transistor according to this embodiment, a greater gate width than can be obtained in a conventional transistor structure as shown in FIGS. 1 or 2 can be achieved with an active region of the same size as a conventional transistor structure. That is, it is possible to achieve a transistor having a greater current driving capability without causing a reduction in the integration density.

In practical integrated circuits in common use in commercial and industrial applications, a great number of similar transistors are formed on the surface of a semiconductor substrate. FIG. 3 also shows a gate electrode 17 of an adjacent transistor.

In the specific example shown in FIG. 3, only one gate electrode 13 is formed over one active region 14 thereby forming one field effect transistor. However, two or more gate electrodes may be formed over the same active region, thereby forming two or more transistors. In this case, the two or more gate electrodes are preferably formed so that the main portion, the end portion, and the connecting portion are substantially the same in shape for all gate electrodes and these gate electrodes are disposed at locations uniformly spaced from each other in the X direction, i.e., the direction perpendicular to the direction that the main portions of gate electrodes extend. Thus, two or more transistors are arranged in the X direction. Preferably, contact areas are formed at grid points in the source and drain regions in the active region and also for those located between adjacent gate electrodes. Furthermore, it is preferable that the contact areas be formed in the respective contact portions of the gate electrodes so that each contact area for the gate electrode is aligned together with the contact areas of the source or drain regions, in the Y direction.

In the case of a CMOS semiconductor integrated circuit, it is preferable that n-channel transistors and p-channel transistors be formed at adjacent locations. In this case, it is preferable that different channel types of transistors be disposed at adjacent locations in the Y direction in which the main portions of gate electrodes extend.

To realize a semiconductor integrated circuit having desired functions, a plurality of transistors similar to that shown in FIG. 3 should be formed on the surface of a semiconductor substrate and proper interconnections should be made among these transistors. The respective transistors may also be formed such that they have their own shape and size optimized depending on their requirements. Furthermore, basic cells each of which includes one or more transistors with the same or different shape and/or size may be arranged in the X and Y directions into an array fashion so as to form a cell array, and transistors in the cell array may be properly connected to achieve a circuit having desired functions. For example, the layout shown in FIG. 3, or the layout which will be described later with reference to FIG. 9, may be employed to form a basic cell, and a plurality of basic cells are disposed in line in the X and Y direction, wherein the layout may be inverted in the X and Y plane as required, thereby forming a cell array. The cell array may be formed over substantially the entire area, except for I/O cells, of the surface of a semiconductor integrated circuit chip. Alternatively, the cell array may be formed only in a particular block on the semiconductor integrated circuit chip.

When a circuit having desired functions is obtained by forming a cell array which includes basis cells and connecting the transistors in the cells to one another, it is preferable to provide contact areas used to make connections to the source and drain regions and to gate electrodes, at uniformly spaced grid points, as shown in FIG. 3. That is, interconnection channels extending in the X or Y direction over the contact areas are formed so that connections between the interconnections in the interconnection channels and desired source regions, drain regions, or gate electrodes may be realized simply by determining whether contacts are formed in the corresponding contact areas by means of a computer aided design (CAD) process.

According to the embodiment shown in FIG. 3, contact areas are formed such that the contact areas are spaced from each other by the same distance in both the X and Y direction. However, the contact areas may also be formed in the X direction with a distance different from that in the Y direction. Furthermore, it is not necessarily required that the centers of contact areas be exactly at grid points. In a practical production process, even if the center of each contact area is set exactly at the corresponding grid point in the CAD data associated with a mask used to produce a semiconductor integrated circuit, the centers of contact holes actually formed in contact areas can be shifted from grid points due to alignment errors in photolithography processes. Furthermore, a particular contact area may be intentionally shifted from the corresponding grid point so as to obtain a sufficient alignment margin between, for example, a gate electrode and a contact to a source or drain region. However, it is not desirable that such an intentional or unintentional deviation is too great. That is, it is desirable that the locations of contact areas be determined taking into account the sizes of contact holes and interconnection, the alignment margins among contact holes and interconnections, and other factors, so that connections to the interconnections in the interconnection channels can be realized simply by determining whether contacts are formed in the corresponding contact areas.

On the other hand, when transistors are formed into their own shape and size individually optimized depending on the characteristics required for the respective transistors, it is not necessarily required that the contact areas be aligned in the X or Y direction. On the contrary, it is desirable that the locations of respective contact areas be adjusted so as to minimize the sizes of the respective transistors. Instead of forming contact areas regardless of whether they are actually used or not, contact areas may be formed only at locations where contacts are to be actually formed.

In the layout shown in FIG. 3, the gate electrode has inclined portions, i.e., the end portion 13B and the connecting portion 13C, inclined at an angle 45° relative to the main portion 13A and formed at both ends, at upper and lower positions in FIG. 3, of the main portion 13A extending in the Y direction. However, it is not necessarily required that an inclined portion is formed at both ends of the main portion. Only either the connecting portion or the end portion may be inclined. To achieve a shorter connection between the contact portion and the main portion of the gate electrode, it is more desirable that the connecting portion be inclined, because the contact area formed in the contact portion is aligned in the Y direction with respect to the contact areas formed in the active region at either side of the main portion of the gate electrode. That is, because the contact area of the gate electrode is formed at a location shifted from a prolonged line of the main portion of the gate electrode, the distance between the contact portion and the main portion of the gate electrode becomes shorter if the connecting portion is inclined toward the contact area.

When the Y-direction size of the active regions is fixed, the total gate width increases with the angle at which the connecting portions is bent. However, if there is no active region under the inclined portion(s) of the gate electrode, no increase in the gate width can be achieved. Therefore, if the X-direction size of the active regions is fixed, there is an upper limit in the bending angle that results in an increase in the gate width.

In the layout shown in FIG. 3, the gate electrode includes the main portion extending in the Y direction and the inclined portions directly connected to the main portion and bent at 45° with respect to the main portion. However, the invention is not limited to such a structure but the inclined portions may be bent, for example, at a plurality of positions. Alternatively, the inclined portions may be formed into a curved shape.

In the case where the inclined portions are bent at a fixed angle, if the main portion 13A of the gate electrode is shortened and the inclined portions, i.e., the end portion 13B and the connecting portion 13C, are lengthened, then the gate width increases. It is even possible to eliminate the main portion so that the entire portion of the gate electrode over the active region acts as an inclined portion. However, when the X-direction size of the active regions is fixed, there is also an upper limit in the increase in the gate width achieved by increasing the length of the inclined portions. In order to form contact areas at minimum intervals in the X direction in the active regions, i.e., source and drain regions, at both sides of gate electrodes, it is desirable that gate electrodes have a portion extending substantially in the Y direction. In particular, when a plurality of contact areas are formed in each source region and also in each drain region so that the contact areas are located at fixed intervals in the Y direction, thereby achieving high flexibility of connections, it is desirable that the main portion extending substantially in the Y direction has a length at least equal to or greater than the spacing in the Y direction between adjacent contact areas.

In FIG. 3, the diffusion region at the left side, as shown in the figure, of the gate electrode is referred to as the "drain region", and the diffusion region at the right side is referred to as the "source region". However, these designations are just for convenience of explanation. In practice, either diffusion region may be used as a drain or source. This is also true in any layout described herein below.

In the transistor layout shown in FIG. 3, as described above, the gate electrode 13A has a connecting portion and an end portion inclined relative to the main portion, thereby achieving a greater gate width than can be obtained in the conventional structure active regions of the same size. However, in the transistor having the layout shown in FIG. 3, the driving capability is not necessarily increased by the same factor by which the gate width is increased. In field effect transistors having small sizes fabricated by advanced technologies, the current driving capability of field effect transistors greatly varies depending not only on the length and width of the channel region, but also on a parasitic resistance associated with the source and drain regions lying in the current path in series with the channel regions. Therefore, to increase the current driving capability, thereby enhancing the operating speed of an integrated circuit, it is very important, from the transistor design viewpoint, to achieve a sufficient reduction in the source and drain resistances as well as an increase in the channel width.

As shown in FIG. 3, the drain length $D_A$ of the portion of the drain region corresponding to the main portion of the gate electrode 13A is much greater than the gate length L. Herein, the drain length is defined as the length of the drain region measured in a direction perpendicular to the edge of the gate electrode. In the case of the transistor shown in FIG. 3, because the impurity concentration of the portions of the source and drain regions under the side wall films 18 of the gate electrode is low, and thus the resistance of these portions is high, the drain length is defined by the distance from the outer edge of the side wall film to the perimeter of the active region. In contrast, the drain length $D_B$ of the portion of the drain region corresponding to the end portion of the gate electrode is smaller than $D_A$. That is, the drain length $D_B$ of this portion located near the main portion of the gate electrode is similar to the gate length L. The drain length $D_B$ decreases with the position toward the edge of the active region and becomes zero at the edge of the active region. As a result, the resistance of this portion of the drain region in the path via which a current is supplied to the channel region under the end portion 13B becomes high compared with the resistance of the portion of the drain region forming a path via which a current is supplied to the channel region under the main portion 13A. In particular in the layout shown in FIG. 3, the resistance of this portion becomes even higher because of the high resistance of the portion of the drain region under the gate side wall film 18. This means that the increase in the gate width obtained by bending the end portion of the gate electrode does not necessarily make a contribution to an increase in the driving capability.

On the other hand, the drain length of the portion corresponding to the connecting portion 13C is rather greater than that corresponding to the main portion of the gate electrode. However, the source length, defined as the length of the source region measured in a direction perpendicular to the edge of the gate electrode, becomes small and thus the resistance of the source region becomes high. For this reason, the increase in the gate width in this region does not necessarily make a contribution to an increase in the driving capability. Furthermore, the increase in the source resistance causes an increase in the threshold voltage change due to the substrate bias effect. As a result, a further reduction in the driving capability occurs.

Figure 4:
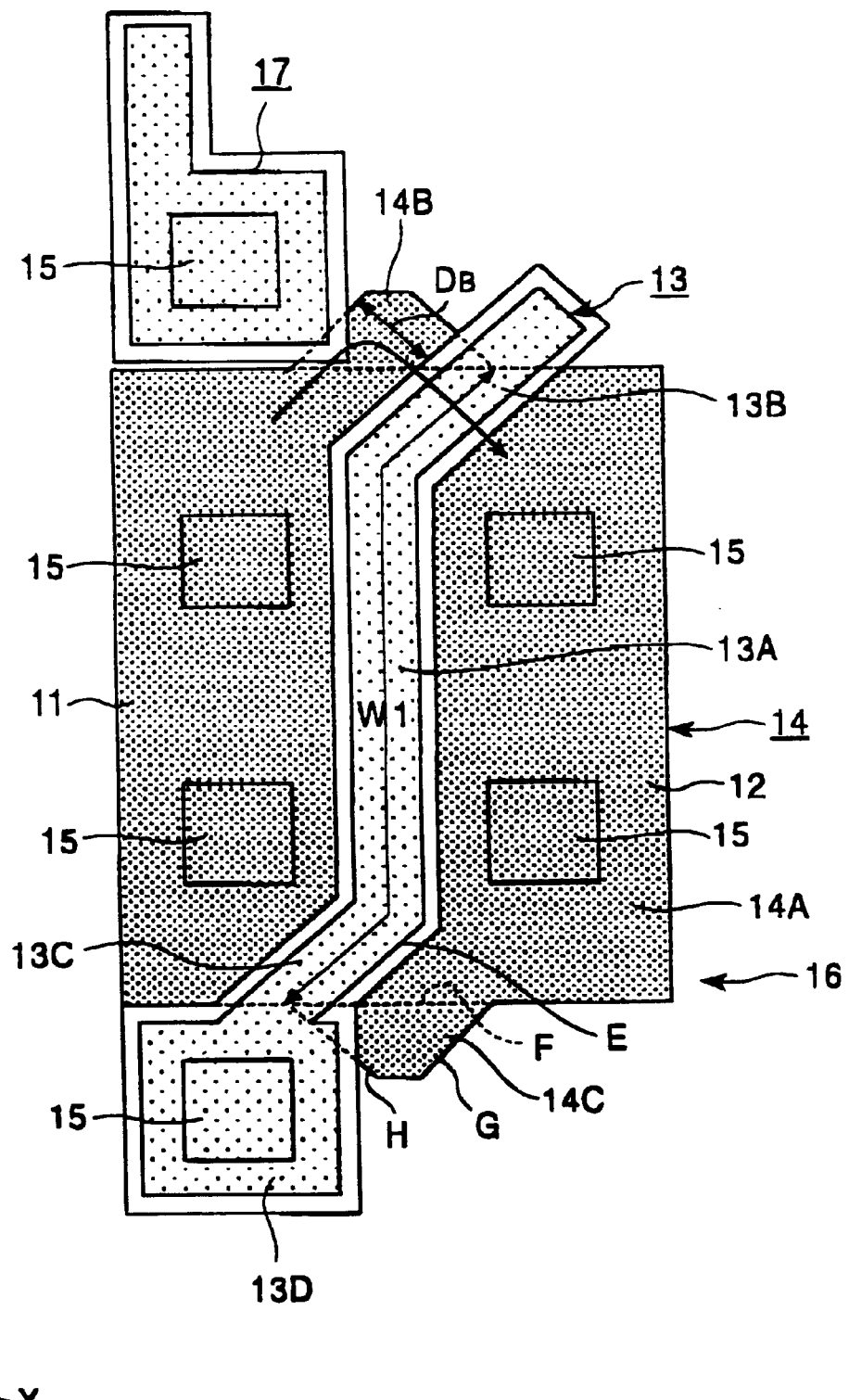
FIG. 4 is a plan view showing the layout of a field effect transistor according to a second embodiment of the invention.

FIG. 4 illustrates another layout of a transistor that can bring about a greater increase in the driving capability than can be obtained in the first embodiment. According to the second embodiment, the gate electrode has a similar shape to that employed in the first embodiment. That is, the gate electrode consists of a main portion 13A extending in the Y direction and inclined portions, i.e., a connecting portion 13C and an end portion 13B, inclined in a direction at 45° with respect to the main portion.

However, the shape of the active region is different from that employed in the first embodiment. The active region includes a main portion 14A having a similar shape to the active region according to the first embodiment, that is, having a rectangular shape whose sides are parallel to the X or Y direction and also includes first and second expanded portions 14B and 14C. Each expanded portion has a trapezoidal shape and is attached to a part of an edge, i.e., either side extending in the X direction, in this specific example, of the main portion of the active region. The right edge E of the connecting portion of the gate electrode extends beyond the boundary line F between the main portion 14A and the second expanded portion 14C of the active region. The edge E makes a first angle substantially smaller than the right angle (90°) with respect to the boundary line F. In contrast, the right edge E of the connecting portion of the gate electrode makes an angle closer to the right angle than the first angle with respect to an edge, i.e., a side H of the trapezoid, of the second expanded portion 14C. Similarly, the left edge of the end portion of the gate electrode extends beyond the boundary line between the main active region 14A and the first expanded portion 14B, wherein the left edge of the end portion makes a second angle substantially smaller than the right angle to the boundary line.

The drain region is expanded to the extent defined by this first expanded portion. As a result, the part of the drain region corresponding to the channel region formed below the end portion of the gate electrode becomes wider than that of the first embodiment. In other words, the drain length becomes longer. More specifically, the drain region is expanded so that the drain length is at least similar to or greater than the width, i.e., gate length, of the gate electrode. In addition to the drain region in the main active region, the expanded drain portion provides a path via which a current is supplied to the channel region formed below the end portion of the gate electrode, and thus the resistance of the drain region becomes small. Similarly, the source region is expanded to an extent defined by the second expanded portion and thus the portion of the source region corresponding to the channel region formed below the connecting portion of the gate electrode is expanded compared to that of the first embodiment. As a result, the source length becomes greater. This results in a reduction in the resistance of the portion of the source region corresponding to the channel region formed below the connecting portion of the gate electrode. Thus, in the transistor according to the second embodiment, unlike the first embodiment, the current driving capability is enhanced by substantially the same factor by which the gate width is increased.

More specifically, the length of the base side, i.e., the side directly connected to the main portion of the active region, of the expanded portion having the trapezoidal shape may be, for example, 1.05 μm, and two sides adjacent to the base side may each form an angle of 45° to the base side. Furthermore, the height, i.e., the distance from the base side to the upper side, may be 0.4 μm.

If degradation occurs in the isolation characteristics from adjacent active regions as a result of the formation of the expanded portion, the characteristics of the semiconductor integrated circuit become poor. In practice, however, in the case where the contact portion used to make a contact to the gate electrode is formed in the isolation region 16, the spacing between adjacent active regions is determined by the size required to form the contact, and thus the spacing between adjacent active regions is generally set to be greater than the minimum value required to achieve sufficient isolation. Therefore, even if the expanded portion is formed on the same side of the active region where the contact to the gate electrode is formed, no degradation occurs in the isolation characteristics as long as the expanded portion is not too large.

From the viewpoint of the reduction in the resistances of the drain and source regions thereby enhancing the driving capability, it is preferable that the expanded portions have a large size. However, the driving capability does not substantially increase when the size of the expanded portion is increased beyond a certain extent. On the contrary, expansion to a too great extent results in a reduction in the operating speed due to an increase in the diffusion capacitance of the source and drain regions. In the example shown in FIG. 4, the sizes of the expanded portions 14B and 14C are determined so that the drain length and the source length are not smaller than the width of the gate electrode, i.e., the gate length, at any position along the entire channel region.

The required size of the expanded portions depends on the gate length, the length of the inclined portions, the sheet resistance of the portions of the source and drain diffusion regions under the gate side wall films and outside the gate side wall films, and the angle of the inclined portions. The required size of the expanded portions also depends on the shape and the location of the expanded portions themselves. That is, it is desirable that the optimum shape, size, and location of the expanded portions be determined so that the portions of the source and drain diffusion regions formed in the expanded portions serve to provide a path via which a current is supplied to the channel region formed below the inclined portions of the gate electrode, thereby achieving a reduction in the resistance of the diffusion regions, thus enhancing the current driving capability of the transistor.

When the source and drain diffusion regions are formed by doping an impurity into the surface of a silicon substrate, if the drain length or source length, that is, the distance from the edge of the gate electrode, from the outer edge of the gate side wall film when the gate electrode has the side wall film, to the perimeter of the active region is of the order three times the width of the gate electrode or greater, then it is generally possible to obtain a sufficiently low resistance for the diffusion regions, thereby enhancing the driving capability. On the other hand, in the case where the diffusion regions are formed in such a manner that the surface region of a silicon substrate doped with an impurity is covered with a metal silicide layer formed by a known salicide process, if the distance from the edge of the gate electrode, from the outer edge of the gate side wall film when the gate electrode has the side wall film, to the perimeter of the active region is of the order equal to the width of the gate electrode or greater, then it is generally possible to obtain a sufficiently low resistance for the diffusion regions thereby enhancing the driving capability.

As a matter of course, it is required that the expanded portions should be formed at proper locations so that the diffusion regions of the expanded portions can provide a path via which a current is supplied to the channel region formed below the inclined portions of the gate electrode thereby reducing the resistance of the diffusion regions. For example, in the case of the diffusion region on the upper side in FIG. 3, the left edge of the end portion 13B of the gate electrode makes an angle substantially smaller than the right angle to the upper edge of the active region 14. In this area, the drain length $D_B$ has a small value. In the transistor shown in FIG. 4, to ease the problem arising from the small drain length, the expanded portion 14B is formed in such a manner that it is in attached to a part of the edge of the main portion below the left edge of the end portion 13B of the gate electrode. Thereby, the diffusion region formed in the expanded portion 14B provides a path via which a current is supplied to the channel region formed below the end portion of the gate electrode. Thus, a reduction in the resistance of the diffusion region is achieved. In contrast, if the expanded portion 14B is formed so that it is attached to a part of the edge of the main portion 14A of the active region on the right side, or the source side, of the end portion 13B of the gate electrode, the diffusion region in this expanded portion cannot provide an effective current supplying path. That is, the expanded portion formed at such a location cannot make a significant contribution to the reduction in the resistance of the diffusion region, because the main portion of the active region by itself can provide a sufficiently large source length thereby achieving a low enough resistance for the source diffusion region.

On the other hand, on the lower side in FIG. 3, the right edge of the connecting portion 13C of the gate electrode makes an angle substantially smaller than the right angle with respect to the lower edge of the active region 14. In this area, the source length has a small value. In the transistor shown in FIG. 4, to ease the problem arising from the small source length in this area, the expanded portion 14C is formed in such a manner that it is attached to a part of the edge of the main portion of the active region 14A on the right side of the end portion 13B of the gate electrode. Thereby, the diffusion region formed in the expanded portion 14C provides a path via which a current is supplied to the channel region formed below the end portion 13B of the gate electrode thus achieving a reduction in the resistance of the source diffusion region.

Although in the example shown in FIG. 4, the expanded portions are each formed into a trapezoidal shape, the invention is not limited to the trapezoidal shape. A triangular shape, rectangular shape, or other shapes may also be employed as required. However, it is desirable that the expanded portions be formed into a shape that causes the drain length or source length to have a sufficiently large value over the substantially entire channel region formed under the inclined portions of the gate electrode. In the specific example shown in FIG. 4, the expanded portions are each formed into a trapezoidal shape in such a manner that one side of the trapezoid becomes parallel to the edge of the corresponding inclined portion of the gate electrode and the other side becomes perpendicular to the edge of the corresponding inclined portion of the gate electrode.

Furthermore, in the layout shown in FIG. 4, one end of the boundary line between each expanded portion and the main portion of the active region is located under the gate electrode. More specifically, in the case of the expanded portion on the lower side in FIG. 4, the left end of the boundary line is located around a position below the center of the width of the inclined portion of the gate electrode. On the other hand, the right end of the boundary line is located to the right of the right edge of the gate electrode that will have a high-resistance diffusion region if there is no expanded portion. This is an example of a desirable manner in which the expanded portions are disposed to obtain a low-resistance diffusion region over the entire length of the gate width, denoted by an arrow in FIG. 4. Further expanding the expanded portions can further reduce the resistance of the diffusion region. For example, in the case of the expanded portion on the lower side of FIG. 4, if the one end of the boundary line is located to the left of the center of the gate electrode, a further reduction in the diffusion region resistance is achieved. A still further reduction in the diffusion region resistance is possible if the one end of the boundary line is located to the left of the left edge of the gate electrode. In practice, however, there is an upper limit in the size of the expanded portion. On the other hand, in the expanded portion on the lower side of FIG. 4, even if the one end of the boundary line is located to the right of the center of the gate electrode, the driving capability is increased to a certain extent compared to the driving capability of the transistor with no expanded portion.

In practical semiconductor devices, the diffusion regions, that is, the source and drain regions formed in the active region, are not located in the same plane in which the gate electrode is located. The gate electrode is located over the active region via the gate insulating film. Therefore, the drain distance, the source distance, and the distance between the edge of the gate electrode and the perimeter of the active region are defined by distances measured in the layout plane such as that shown in FIG. 4.

In the layout shown in FIG. 4, a part of the contact portion of the gate electrode is located over the expanded portion 14C of the active region. As a result, a channel region is also formed in the active region under this part. However, this portion does not have a significant influence on the transistor characteristics. The characteristics of the transistor are determined mainly by the channel region formed in the active region under the main portion 13A and the inclined portions, i.e., the end portion 13B and the connecting portion 13C, of the gate electrode because these portions have a smaller gate length and a greater gate width than those of the channel region under the contact portion.

The layouts shown in FIGS. 3 and 4 are given in the form of a plan view representing the shapes of various elements of a transistor. These layouts can also be understood as drawings representing shapes of masks used to produce a semiconductor device or representing mask data produced on a CAD system for designing a semiconductor device. That is, the actually produced transistor, the mask used to produce the transistor, and the mask data used to produce the mask are essentially the same in shapes, although they may be different in size. For example, in the case where a reduction projection exposure apparatus is used to produce a semiconductor device, an actual transistor pattern is produced by reducing the mask pattern by a predetermined factor. In the strict sense, the shapes of respective elements of the transistor are different from those represented by the original mask data because of limitations in the mask pattern accuracy and the accuracy in producing the semiconductor device.

For example, even if the active region shown in FIG. 3 is represented as a rectangular-shaped region in CAD data, the corners of the active region of an actually produced semiconductor device are rounded. Even if the expanded portions of the active region in FIG. 4 are represented as a trapezoidal shape in CAD data, they are produced into a generally rounded shape. The gate electrode in FIGS. 3 and 4, which is represented as a pattern composed of only straight lines in CAD data, is produced into a shape whose corners between the main portion and the end portion or connecting portion are rounded. That is, although the elements in FIGS. 3 and 4 are composed of only straight lines, the shapes of these elements of an actually produced semiconductor device are composed of partially curved lines. Nonetheless, most of the edges of the actually produced elements are substantially straight.

In the above description, it is assumed that the CAD data includes only straight lines. Although this is usually the case, it is not necessarily required.

In the specific example shown in FIG. 4, the edges of the inclined portion of the gate electrode are parallel to one side of the corresponding expanded portion of the active region and perpendicular to the other side of the expanded portion. However, even if the CAD data is created to represent such a shape, exactly parallel or perpendicular relationships are not necessarily obtained in an actually produced semiconductor device because of a change in shape during a production process. In other words, in the actual semiconductor device, one or both edges are curved and thus the angle cannot be defined in the strict sense. Therefore, the angles described above include certain errors at least in the actually produced semiconductor device. It should be understood that any angle described herein in the present invention may include such an error.

In semiconductor devices actually produced, the gate electrode is not located in the same plane in which the active region is located. That is, the gate electrode is located above the active region via the gate insulating film. Therefore, the angles between the edges of the gate electrode and the edges of the active region are defined by angles on the plan view such as that shown in FIG. 4.

In the first and second embodiments described above, the gate electrode includes the main portion 13A extending in the Y direction and also includes inclined portions, that is, the end portion 13B and the connecting portion 13C that are located on either end of the main portion 13A and that are inclined by 45° relative to the main portion. However, the invention is not limited to such a layout or structure.

Figure 5:
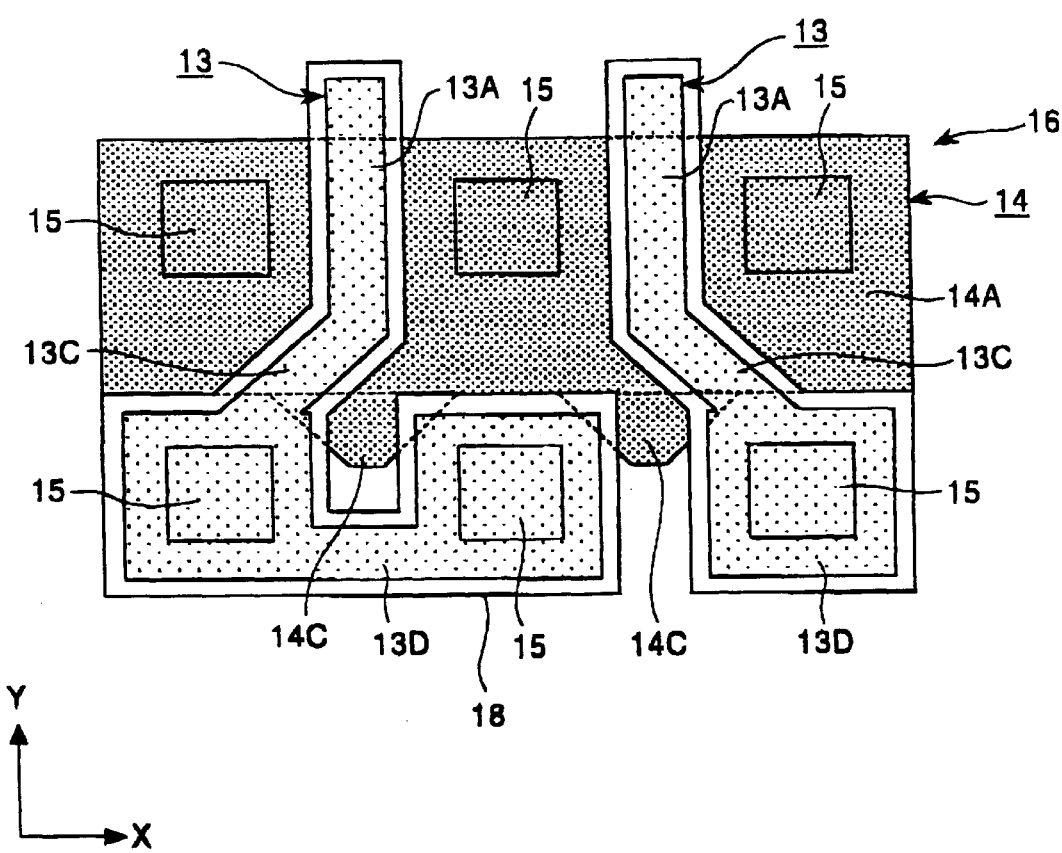
FIG. 5 is a plan view showing of the layout of a basic cell according to a third embodiment of the invention.

FIG. 5 illustrates a layout according to a third embodiment of the present invention. According to the third embodiment, two gate electrodes 13 are formed over an active region 14 thereby forming two transistors. The active region includes a main portion 14A having a rectangular shape whose sides are parallel to the X or Y direction. The two gate electrodes each include a main portion 13A extending in the Y direction. Unlike the structures shown in FIGS. 3 and 4, no inclined portion is provided on the upper side of the gate electrode and the main portion extends upward beyond the edge of the main portion of the active region over an isolation region 16. For each of the gate electrodes, contact portion 13D is formed over the isolation region 16 and in an area along the lower side of the main portion of the active region 14A. The contact portion 13D is connected to the main portion 13A via the connecting portion 13C inclined at 45° relative to the main portion 13A. The inclined connecting portion 13C increases the gate width. If the Y-direction size of the main portion of the active region 14A is, for example, 1.7 $\mu$m, and the length of the main portion of the gate electrode located over the active region is 1.2 $\mu$m, then the length of the connecting portion located over the active region becomes 0.7 $\mu$m. This means that the inclined portion causes the gate width to become about 12% greater than can be obtained with no inclined portion.

Furthermore, expanded portions 14C corresponding to the respective gate electrodes and having a trapezoidal shape are formed in such a manner that they are attached to the lower side of the main portion of the active region 14A. In each expanded portion, the base side in contact with the main portion 14A is, for example, 1.1 $\mu$m and two sides adjacent to the base side make an angle of 45 ° to the base side. The height of each expanded portion is 0.45 $\mu$m. The connecting portion 13C of the left one of the gate electrodes is bent to the left from the direction in which the main portion 13A extends. The right edge of the connecting portion 13C of this gate electrode extends beyond the boundary line between the expanded portion 14C and the main portion 14A wherein the right edge of the connecting portion 13C makes an angle of 45° with respect to the boundary line. The left one of the expanded portions 14C increases the distance from the right edge of this connecting portion 13C to the perimeter of the active region. On the other hand, the connecting portion 13C of the gate electrode located on the right side of FIG. 5 is bent to the right from the direction in which the main portion 13A extends. The left edge of this connecting portion 13C extends beyond the boundary line between the right one of the expanded portions 14C and the main portion of the active region 14A wherein the left edge of this connecting portion 13C makes an angle of 45° with respect to the boundary line. This expanded portion 14C increases the distance from the left edge of this connecting portion 13C to the perimeter of the active region. As a result of the increase in the distance between the edge of the gate electrode and the perimeter of the active region, the resistance of the diffusion region corresponding to the channel region formed under the connecting portion 13C of each gate electrode is reduced. Thus, the current driving capability of the transistor is effectively increased.

In the layout shown in FIG. 5, the active region between the two gate electrodes may be used as a common source or drain of the two transistors, depending on connections of the two transistors. Alternatively, this active region may also be used as the source region for one transistor and as the drain region for the other transistor. In the layout shown in FIG. 5, one contact area is formed to the left of the left gate electrode, one between the two gate electrodes, and one to the right of the right gate electrode, and thus a total of three contact areas are formed in such a manner that they are aligned in the X direction. Furthermore, the contact portions 13D of the gate electrode has one or two contact areas aligned in the Y direction with corresponding contact areas of the active region. These three contact areas of the gate electrodes themselves are aligned in the X direction. The contact portion for the left gate electrode is formed into a shape consisting of two squares connected to each other. One contact area is formed in each of these square areas. The connecting portion of the left gate electrode is connected to the left one of these two square-shaped contact areas.

In the layout shown in FIG. 5, the connecting portions of the gate electrode are bent to the left in the case of the left gate electrode and to the right in the right gate electrode from the direction in which the main portion of each gate electrode extends. However, according to the invention, it is not necessary that the two gate electrodes, which are formed over a common active region, be bent in opposite directions. In the case where the active region between the two gate electrodes is used, in most cases, as the common source or drain region, it is preferable that the two gate electrodes be bent in opposite directions so that the two transistors have equivalent shapes. That is, it is preferable that the expanded portions of the active region be disposed on the same side of the active region, either in the source or drain. Conversely, when the active region between the two gate electrodes is used, in most cases, as the drain region for one transistor and as the source region for the other transistor, the two gate electrodes may be bent in the same direction so that the two transistors have the same shape.

In the first, second, and third embodiments described above, the gate electrode has a main portion extending in the Y direction and contact areas for the active region and for the gate electrode are formed at grid points. However, the invention is not limited to such a structure.

Figure 6:
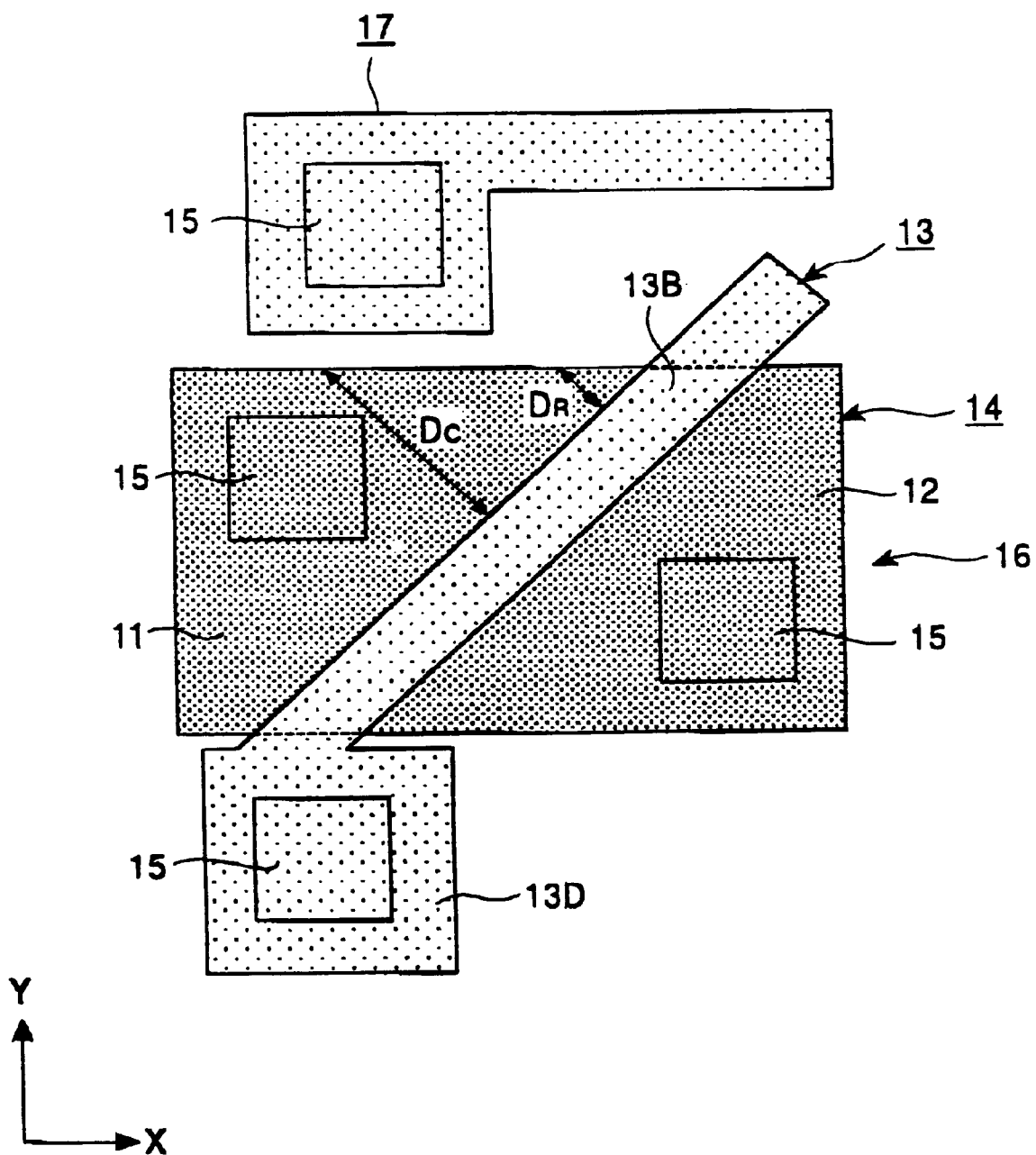
FIG. 6 is a plan view showing the layout of a field effect transistor according to a fourth embodiment of the invention.

FIG. 6 illustrates a layout according to a fourth embodiment of the invention. According to the fourth embodiment, an active region 14 is formed into a rectangular shape whose sides are parallel to the X or Y direction. A gate electrode includes an inclined portion 13B formed over the active region 14 and extending in a direction at an angle of 45° with respect to the Y direction, and also includes a square-shaped contact portion 13D formed over an isolation region 16. The inclined region 13B extends beyond the upper and lower edges, in FIG. 7, of the active region over the isolation region. The lower end of the inclined region is connected to a contact portion. A contact area is formed in the contact portion. Furthermore, the active region has two contact areas whereby one contact area is formed at one side of the gate electrode and the other contact area is formed at the other side. A gate electrode 17 of an adjacent transistor is also shown on the upper side of FIG. 6. According to the fourth embodiment, the gate electrodes have no side wall film. Furthermore, according to this embodiment, contact areas are not located at grid points. In this embodiment, the gate width is increased to about 1.4 times the Y-direction size of the active region by inclining the entire gate electrode located over the active region, at 45° with respect to the Y direction.

According to the fourth embodiment shown in FIG. 6, if the part of the active region at the left side of the gate electrode is used as the drain region, the drain length $D_R$ becomes much smaller near the upper edge of the active region 14 than the drain length $D_C$ in a central area. As a result, the drain-source current path in the area near the upper edge of the active region 14 includes a high parasitic resistance arising from the short drain length $D_R$, and thus the drain resistance has a high value in this area. For this reason, the current driving capability is not increased by the same factor by which the gate width is increased by inclining the gate electrode by 45°.

Figure 7:
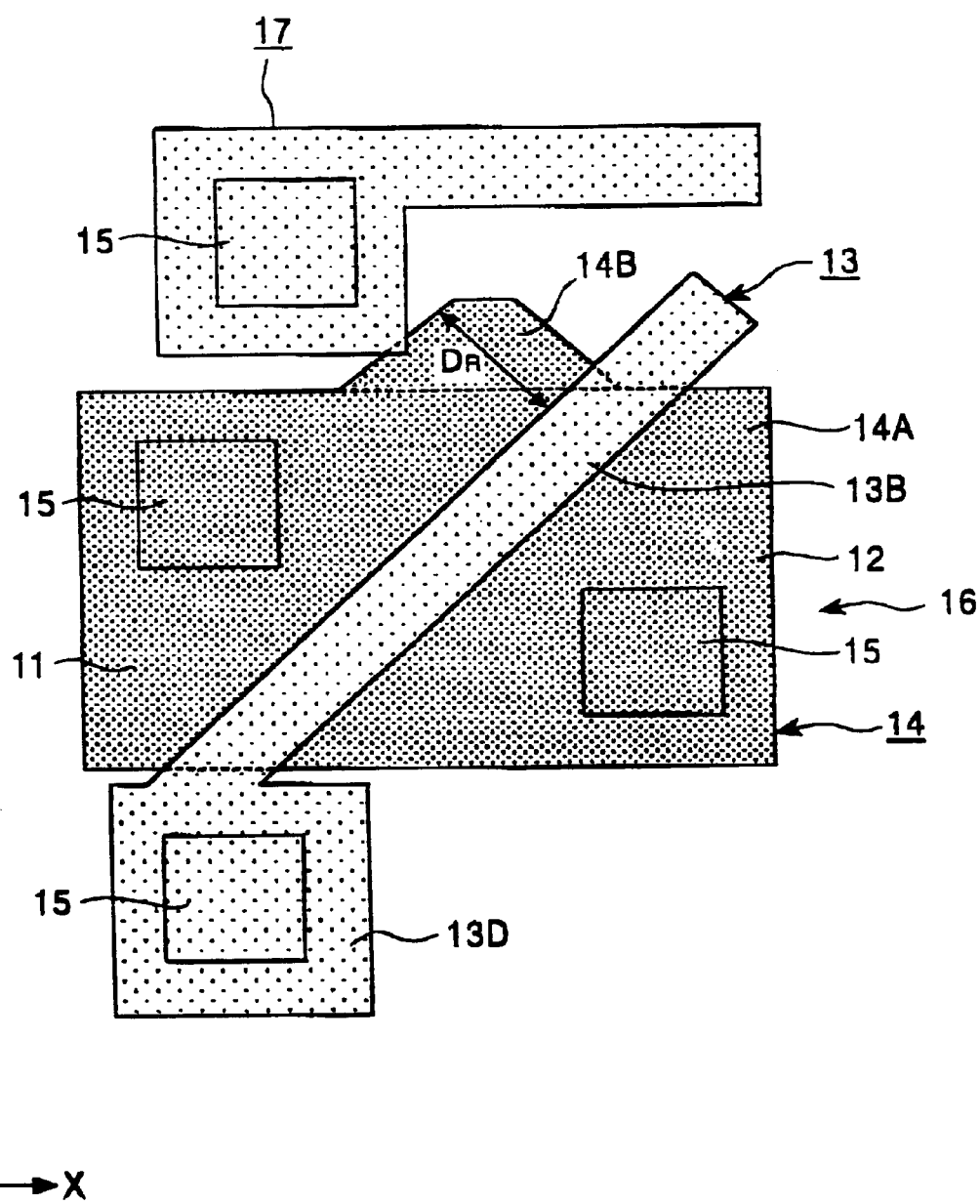
FIG. 7 is a plan view showing the layout of a field effect transistor according to a fifth embodiment of the invention.

FIG. 7 illustrates a layout according to a fifth embodiment of the invention. According to the embodiment, an expanded portion 14B is added to the rectangular-shaped active region that is employed in the layout of FIG. 6 and that serves as a main portion of the active region 14A in the fifth embodiment. The expanded portion 14B has a shape similar to that employed in the third embodiment. The expanded portion 14B is attached to a portion of the upper edge, extending in the X direction, of the main portion 14A. One end of the boundary line between the expanded portion 14B and the main portion 14A is located below the inclined portion of the gate electrode 13B. The left edge of the inclined portion of the gate electrode extends beyond the boundary line between the main portion 14A and the expanded portion 14B of the active region over the isolation region 16. The left edge of the inclined portion of the gate electrode makes an angle of 45° with the boundary line between the expanded portion and the main portion of the active region.

The expanded portion 14B increases the distance from the left edge of the inclined portion of the gate electrode 13B to the perimeter of the active region 14. As a result, the diffusion region expands into this area and thus the resistance of the diffusion region becomes smaller. This results in a further increase in the current driving capability.

Table 1 shows the difference in the current driving capability between layouts in which the active region has expanded portions and layouts in which the active region has no expanded portion. In the first row, the layout shown in FIG. 4, i.e., having expanded portions, was compared with the layout shown in FIG. 3, i.e., having no expanded portion. An increase of about 9.5% in the current driving capability was achieved. In the second row, the layout shown in FIG. 7, i.e., having an expanded portion, was compared with the layout shown in FIG. 6, i.e., having no expanded portion. An increase of about 3.8% in the current driving capability was achieved. In the third row, the layout shown in FIG. 5 having expanded portions was compared with a layout which is similar to the layout in FIG. 5, but which has no expanded portion. An increase of about 7.4% in the current driving capability was achieved.

TABLE 1

|  | With expanded portions (Current) | With no expanded portion (Current) | Increase of current |
| --- | --- | --- | --- |
| FIGS. 3, 4 | 2.01 mA | 1.84 mA | +9.5% |
| FIGS. 6, 7 | 1.68 mA | 1.62 mA | +3.8% |
| FIG. 5 | 0.85 mA | 0.79 mA | +7.4% |

The above evaluation was performed under the following measurement conditions:

Vgs=3.3 V

Vds=3.3 V

Table 2 shows the sizes and sheet resistances of various portions of the layouts for which the current driving capability is shown in Table 1.

TABLE 2

|  | FIGS. 3, 4 | FIGS. 6, 7 | FIG. 5 |
| --- | --- | --- | --- |
| Gate length | 0.35 μm | 0.4 μm | 0.35 μm |
| Width of gate side wall film | 150 nm | (none) | 150 nm |
| Sheet resistance of diffusion region (outside of the gate side wall) | 70 Ω/□ | 70 Ω/□ | 70 Ω/□ |

TABLE 2-continued

|  | FIGS. 3, 4 | FIGS. 6, 7 | FIG. 5 |
|---|---|---|---|
| Sheet resistance of diffusion region (under the gate side wall) | 5 kΩ/☐ | (none) | 5 kΩ/☐ |
| Length of straight portion of gate | 2.3 μm | (none) | 1.2 μm |
| Length of inclined portions | 1.5 μm (both sides) | 2.6 μm | 0.7 μm |
| Inclination angle | 45° | 45° | 45° |
| Length of extension over isolation region | 0.6 μm | 0.6 μm | 0.4 μm |

In Table 2, the length of straight portion of gate refers to the length measured along the center line of the main portion of the gate located over the active region, shown in FIGS. 3, 4, and 5. The length of inclined portion refers to the length measured along the center line of the inclined portions of the gate electrode located over the active region, shown in FIGS. 3, 4, 5, 6, and 7. The length of extension over the isolation region refers to the length of the portion of the gate electrode extending beyond the edge of the active region over the isolation region.

From Table 1, it can be seen that the current driving capability of a transistor can be increased by adding an expanded portion to the active region at a proper location thereby expanding the diffusion region thus reducing the resistance of the diffusion region. In particular, a large increase in the current driving capability is achieved in transistors with gate side wall films as is the case in FIGS. 3, 4, and 5.

Figure 8:
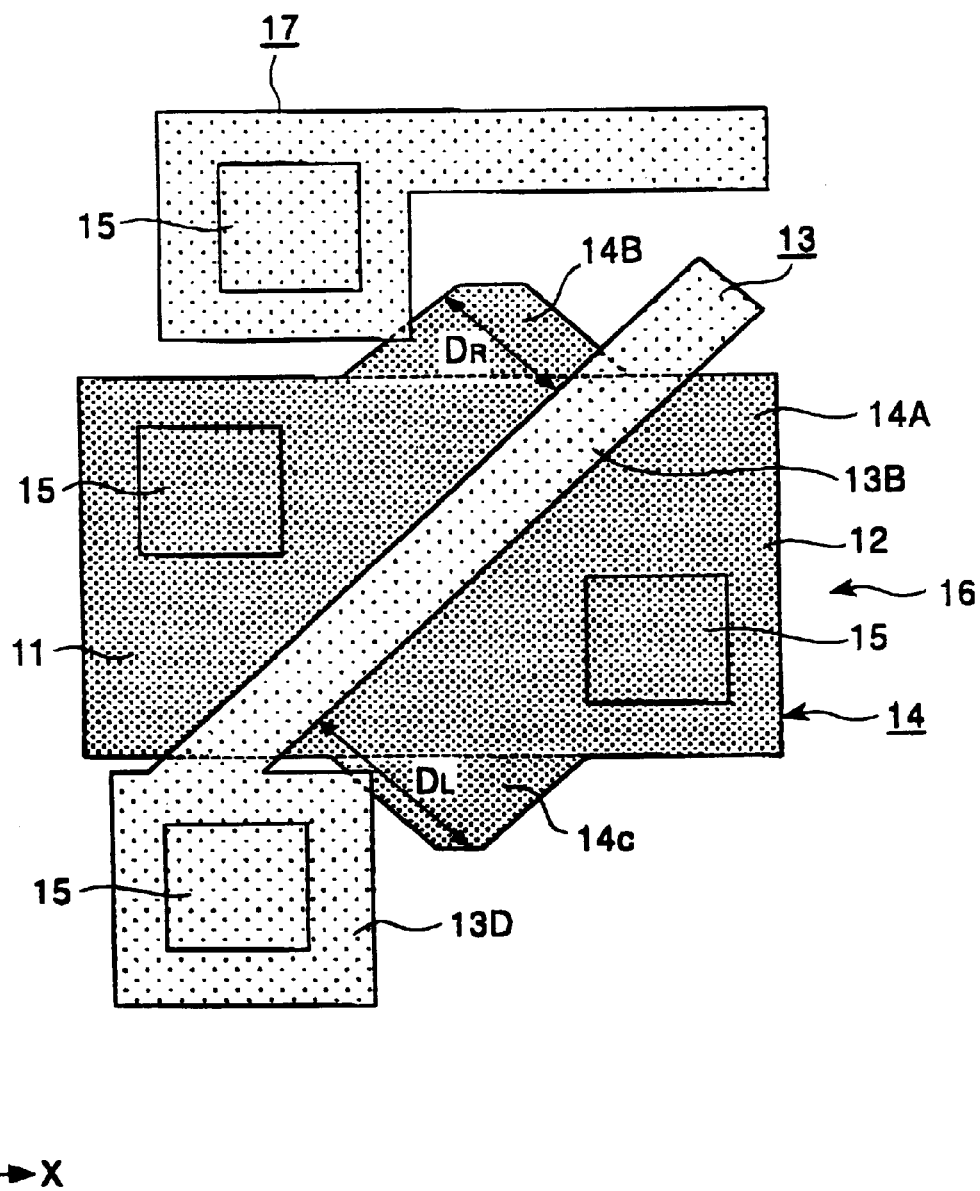
FIG. 8 is a plan view showing the layout of a field effect transistor according to a sixth embodiment of the invention.

FIG. 8 illustrates a layout according to a sixth embodiment of the invention. In this layout, another expanded portion 14C is added to the lower side of the main portion of the active region 14A of the layout shown in FIG. 7. The expanded portion 14C has the same shape and the same size as those of the expanded portion 14B located on the upper side except that one end of the boundary line between the expanded portion 14C and the main portion 14A is not located below the gate electrode. That is, the left end of the boundary line is located below and to the right of the right edge of the inclined portion 13B of the gate electrode. In other words, the right edge of the inclined portion 13B of the gate electrode does not reach any position just over the boundary line between the lower expanded portion 14C and the main portion of the active region 14A. As a result, the expanded portion 14C provided on the lower side of the main portion has a smaller contribution to the reduction in the resistance of the diffusion region and thus a smaller contribution to the increase in the driving capability than the expanded portion 14B provided on the upper side of the main portion 14A. Nonetheless, when there is an area where the distance from the edge of the gate electrode or the edge of the side wall film to the perimeter of the main active region is too small to obtain a sufficiently low resistance of the diffusion region, it is possible to increase the driving capability to a certain extent by forming an expanded portion thereby increasing the above distance at least in a part of the area. In the lower expanded portion 14C according to the present embodiment, as shown in FIG. 8, the left end of the boundary line between the expanded portion 14C and the main portion 14A is apart from the right edge of the inclined portion of the gate electrode by a smaller distance compared to the width of the inclined portion of the gate electrode. In other words, although the right edge of the inclined portion 13B of the gate electrode does not reach any position over the boundary line between the lower expanded portion 14C and the main portion 14A, it reaches an adjacent position over the boundary line. More specifically, the right edge of the inclined portion 13B reaches a position that is apart from the position over the boundary line by a distance smaller than the width of the gate electrode. Therefore, the expanded portion 14C brings about an increase in the distance, denoted by $D_L$ in FIG. 8, between the edge of the gate electrode and the perimeter of the active region at least in a part of the area where the distance is too small if the expanded portion 14C is not provided. Thereby, the resistance of the diffusion region is reduced and thus the driving capability is increased.

Figure 9:
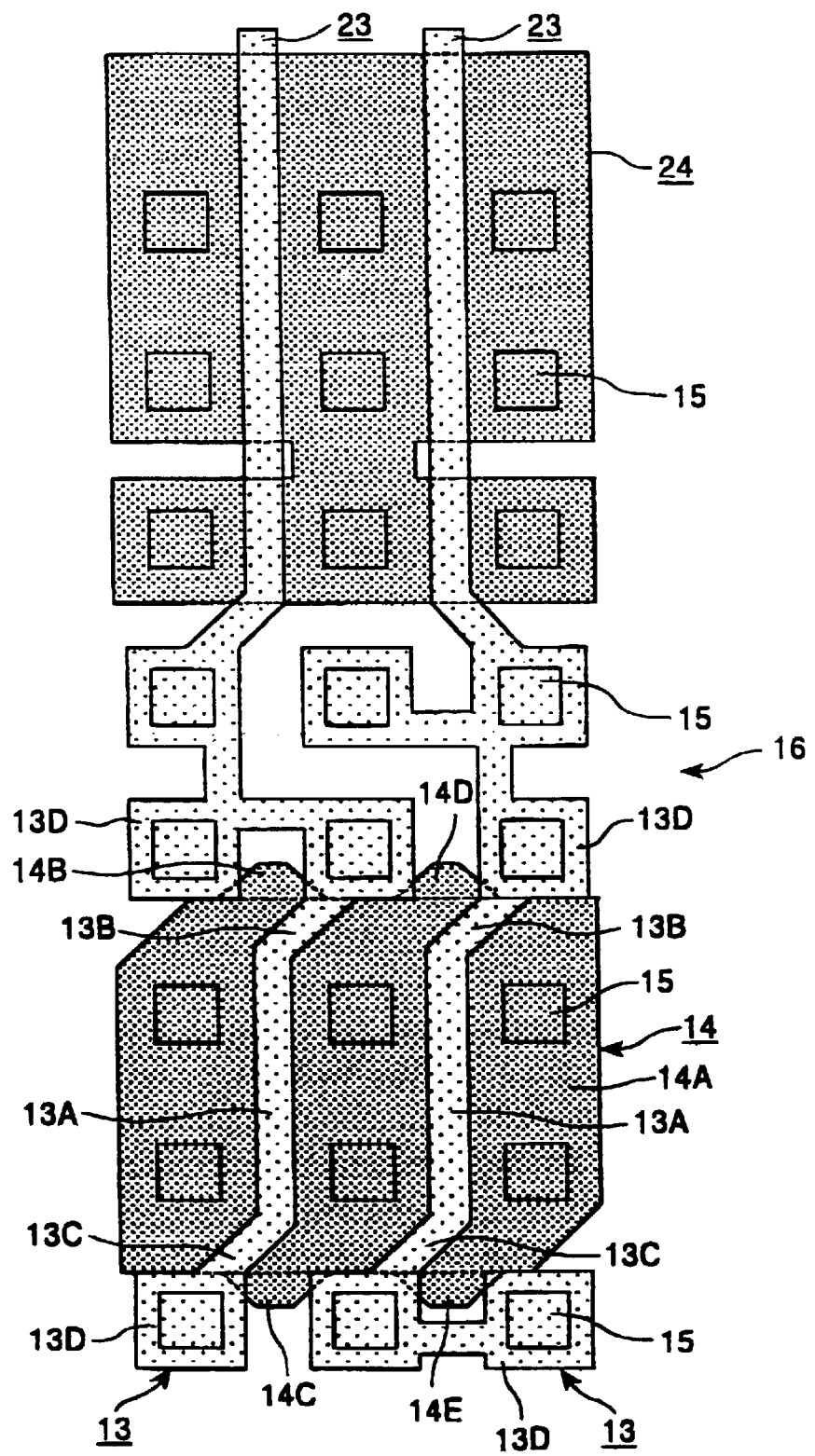
FIG. 9 is a plan view showing of the layout of a basic cell according to a seventh embodiment of the invention.

In the case where the right edge of the inclined portion of the gate electrode does not reach any position just over the boundary line between the expanded portion and the main portion of the active region, the right edge of the inclined portion of the gate electrode does not intersect the boundary line even in the plan view shown in FIG. 9. In such a case, the angle between the right edge of the inclined portion and the boundary line is defined using the prolonged line of one of these or the prolonged lines of both.

In the layouts shown in FIGS. 3 and 6, the active region is formed into a rectangular shape having sides parallel to the X or Y direction. In the layouts shown in FIGS. 4, 5, 7 and 8, the main portion of the active region is formed into a rectangular shape having sides parallel to the X or Y direction. However, in the invention, the shape of the active region is not limited to those employed in the above embodiments.

FIG. 9 illustrates a layout according to a seventh embodiment of the invention. FIG. 9 shows the layout of a basic cell including two n-channel transistors and four p-channel transistors. On the lower half side of FIG. 9, there are provided two gate electrodes over an active region formed on the surface of a p-type semiconductor substrate thereby forming two n-channel field effect transistors. On the other hand, on the upper half side of FIG. 9, there are provided two gate electrodes over an active region 24 formed in an n-well region (not shown) on the surface of the p-type semiconductor substrate. Notches are formed in the active region 24 so that there are four p-channel field effect transistors wherein a gate electrode is shared by two transistors and the other gate electrode is shared by the remaining two transistors. Although not shown in FIG. 9, the gate electrodes has side wall films.

Contact portions 13D for the gate electrodes are formed over the isolation region outside the lower edge of the active region 14 of the n-channel transistors. One contact area for the left gate electrode and two contact areas for the right gate electrode and thus a total of three contact areas are formed in such a manner that they are aligned in the X direction. In the active region of the n-channel transistors, two contact areas are formed to the left of the left gate electrode, two contact areas are formed to the right of the right gate electrode, and two contact areas are formed between the two gate electrodes, and thus a total of six contact areas 15 are formed. These contact areas are formed in such a manner that they are aligned in the X and Y directions. Contact portions 13D for the gate electrodes are also formed over the isolation region between the active region of the n-channel transistors and the active region of the p-channel transistors, wherein three contact areas are formed for the left gate electrodes and three contact areas are formed for the right gate electrode, and thus a total of six contact areas 15 are formed. These contact areas are formed in such a manner that they are aligned in the X and Y directions. The gate electrodes 13 of the n-channel transistors are connected to the gate electrodes 23 of the respective p-channel transistors via the contact portions 13D over the isolation region between the active region of the n-channel transistors and that of the p-channel transistors. Furthermore, in the active region 24 of the p-channel transistors, three contact areas are formed to the left of the left gate electrode, three contact areas are formed to the right of the right gate electrode, and three contact areas are formed between the two gate electrodes, and thus a total of nine contact areas 15 are formed in such a manner that they are aligned in the X direction. These contact areas are all located at grid points aligned in the X and Y directions. More specifically, the contact areas are formed at grid points spaced for example 1.7 μm apart from one another in the X and Y directions.

Each gate electrode formed over the active region of the n-channel transistors includes a main portion 13A extending in the Y-direction and upper and lower connecting portions 13B and 13C connected to the upper and lower ends, respectively, of the main portion 13A. The width of the main portion and the inclined portions of the gate electrode, that is, the gate length is, for example, 0.35 μm. The active region of the n-channel transistors includes a main portion 14A and also includes four expanded portions 14B, 14C, 14D, and 14E each having a trapezoidal shape. The main portion 14A is formed into a rectangular shape having sides parallel to the X or Y direction whose corners at the left-upper position and at the right-lower position are cut away. The size of the main portion measured in the X and Y directions, i.e., the size measured before the corners are cut away, is for example 4.7 μm×4.0 μm. Of the four expanded portions, two are formed on the upper side of the main portion and two are formed on the lower side of the main portion. The length of the base side, i.e., the side attached to an edge of the main portion, of each expanded portion is for example 1.05 μm and two sides adjacent to the base side each have an angle of 45° to the base side. The height of the trapezoid, i.e., the distance between the base side and the upper side, is for example 0.45 μm.

For example, the right edge of the lower connecting portion 13C of the left gate electrode extends to a position just over the boundary line between the main portion 14A and the corresponding expanded portion 14C. The right edge of this connecting portion makes an angle of 45° with the boundary line between the main portion 14A and the corresponding expanded portion 14C of the active region. Similarly, the left edge of the upper connecting portion 13B of the left gate electrode extends to a position just over the boundary line between the main portion 14A and the corresponding expanded portion 14B formed at the left-upper position. The left edge of this connecting portion makes an angle of 45° with the boundary line between the main portion 14A and the corresponding expanded portion 14B of the active region. The edges of the right gate electrode also extend in a similar manner.

By providing inclined portions at the upper and lower ends of the main portion of the gate electrode, the gate width is increased to a value greater than the size of the active region. More specifically, when the length of the main portion of the gate electrode is 2.8 μm, the total length of the two inclined portions becomes about 1.7 μm and thus the total gate width becomes 4.5 μm. Thus, the resultant gate width is about 13% greater than the size of the main portion of the active region measured in the Y direction, i.e., 4.0 μm. The expanded portions formed at locations corresponding to the inclined portions of the gate electrodes serve to expand the source and drain diffusion regions via which a current is supplied to the channel regions formed under the respective inclined portions thereby reducing the resistance of these diffusion regions. As a result, the current driving capability of the transistors is effectively increased.

The layout according to the embodiment described above may be preferably employed as a part of a basic cell including a combination of large-, middle-, and small-sized transistors as disclosed in U.S. Pat. No. 5,289,021. That is, the n-channel transistors on the lower half side of FIG. 9 may be employed as middle-sized n-channel transistors, the two types of p-channel transistors on the upper half side of FIG. 9 may be employed as small-sized p-channel transistors and middle-sized p-channel transistors, respectively. The small-sized n-channel transistors shown in FIG. 5 may be added to the above transistors. If large-sized n-channel transistors and large-sized p-channel transistors are further added, a basic cell including large-, middle-, and small-sized transistors is obtained.

According to this embodiment, as described above, the main portion of the active region of the n-channel transistors is formed into a rectangular shape whose corners at the left-upper position and at the right-lower position are cut away. Because the upper connecting portion of the left gate electrode is bent to the right with respect to its main portion and the lower connecting portion of the right gate electrode is bent to the left with respect to its main portion, the removal of these corners results in substantially no reduction in the driving capability of the transistors. That is, the removal of the corners at the above-described locations does not substantially change the current paths to the channel regions of the respective transistors and thus substantially no increase occurs in the source and drain resistances.

Main portions of the active regions are generally formed into a shape based on a rectangle. However, for various purposes, the shape is often modified into a shape that is not a rectangle in the strict sense. For example, in the layout shown in FIG. 9, the main portion 14A of the n-channel transistors has a rectangular shape whose two corners are cut away. The active region 24 of the p-channel transistors has a rectangular shape with notches. Further, as described previously, these regions may be produced in actual semiconductor devices with partially curved edges due to the limitations of production accuracy. These shapes can be regarded as generally rectangular shapes in the sense that they have two major edges that are substantially straight and substantially parallel with each other and further two major edges that are substantially straight and substantially perpendicular to the former two major edges.

In the embodiment described above, the gate electrode of each p-channel transistor is formed into a straight line shape extending over the active region in the Y direction. However, as a matter of course, the gate electrode of p-channel transistors may also include an inclined portion to increase the gate width. Furthermore, an expanded portion may be added to the active region to further enhance the current driving capability.

In the present embodiment, the gate electrode of each n-channel transistor has inclined portions connected to the upper and lower ends of the main portion. The upper inclined portion is bent to the right with respect to the main portion and the lower inclined portion is bent to the left with respect to the main portion, at an angle of 45° for both the upper and lower inclined portions. The upper and lower inclined portions are equal in length. Furthermore, the active region of the n-channel transistors has four expanded portions having the same shape and the same size wherein two are located below and at the left of the respective upper inclined portions of the gate electrodes bent to the right, and the other two are located below and at the right of the respective lower inclined portions of the gate electrodes bent to the left. The expanded portions are formed so that the positional relationship between the inclined portions of the gate electrode and the corresponding expanded portions of the active region is similar for the upper and lower inclined portions. That is, one end of the boundary line between each expanded portion and the main portion of the active region is located below and at the substantially central point of the gate electrode. By forming inclined portions of the gate electrode connected to the main portion and bent in opposite directions for the upper and lower inclined portions, the diffusion regions at the right and left sides of the gate electrode become the same in shape when seen from the gate electrode. This allows the right and left portions of the active region to be used as either a source or a drain as required, without causing any difference in the characteristics of the transistor. That is, the transistor has a high degree of symmetry. By providing upper and lower expanded portions so that the positional relationship becomes similar for the upper and lower inclined portions of the gate electrode bent in opposite directions, the degree of symmetry is further enhanced.

In the layouts shown in FIGS. 4, 5, 7 and 8, one edge of an inclined portion of each gate electrode, for example, the right edge of the connecting portion 13C in FIG. 4, extends beyond a position over the boundary line between the main portion and the corresponding expanded portion of the active region over the isolation region. However, in the layout shown in FIG. 9, the one edge of inclined portions of each gate electrode of n-channel transistors, for example, the right edge of the lower connecting portion 13C of the right gate electrode of the n-channel transistor, does not extend beyond a position over the boundary line between the main portion 14A and the corresponding expanded portion (14E) of the active region. That is, the edge extends to, and ends at, a position just over the boundary line and the edge is in contact, at that point, with the contact portion.

When the drawing of FIG. 9 represents CAD data, the semiconductor device actually produced can be different in shape from that shown in FIG. 9 due to limitations in size accuracy in the production process and also due to mask alignment errors. For this reason, the edge of the inclined portion of the gate electrode does not necessarily reach a position over the boundary line between the main portion and the corresponding expanded portion of the active region. In this case, the contact portion of the gate electrode can be located partially over the main portion of the active region. Even if there are no alignment errors, the contact portion of the gate electrode can be located partially over the main portion, depending on the size and the shape of the respective portions. Even in such a case, no significant degradation occurs in the characteristics of the transistor. However, if a substantial part of the contact portion of the gate electrode is located over the main portion of the active region, a reduction in the driving capability of the transistor occurs because the gate width of the transistor is determined by the total length of the main portion and the inclined portions located over the active region. Therefore, it is desirable that the edge of the inclined portion of the gate electrode extends at least to an adjacent position over the boundary line between the main portion and the expanded portion of the active region. More specifically, it is desirable that the edge of the inclined portion of the gate electrode extends at least to a position within a distance that is equal to about the width of the inclined portion of the gate electrode from the portion just over the boundary line.

Although the invention has been described above with reference to preferred embodiments concerned with a MOSFET, including an active region formed on a surface of a semiconductor substrate and a gate electrode formed over the active region via an insulating film, the invention is not limited to those embodiments. The invention may also be applied to various types of field effect transistors, such as junction type field effect transistors.

In the field effect transistor according to the invention as described above, the gate width is increased to a value greater than the size of the active region by forming an inclined portion of the gate electrode. As a result, the current driving capability of the field effect transistor is increased without degrading the integration density. When the contact area of the gate electrode is formed at a location that is not on the prolonged line of the main portion of the gate electrode, the invention is particularly advantageous. In that case, the connecting portion for connecting the main portion and the contact portion including the contact are is inclined from the direction in which the main portion extends, and the connecting portion is formed at least partially over the active region. Thereby, the gate width is increased and a short connection between the main portion and the contact portion is achieved.

The driving capability of the transistor can be further effectively increased by forming an expanded portion of the active region at a location corresponding to the inclined portion of the gate electrode, thereby reducing the resistance of the diffusion region.

In the above description, the invention is described as the layout of a field effect transistor and a basic cell including field effect transistors. However, the invention can also be understood for various other configurations. For example, the invention can also be understood as a method for improving the driving capability of a transistor by forming an inclined portion of a gate electrode over an active region and forming an expanded portion of the active region at a location corresponding to the inclined portion. The invention can also be understood as a method of designing a transistor or a basic cell including transistors using a CAD system. That is, the invention provides a method of designing a transistor including a gate electrode having an inclined portion over an active region and further including, as required, an expanded portion of the active region at a location corresponding to the inclined portion of the gate electrode, and also provides a method of designing a basic cell, including such transistors.

What is claimed is:

1. A semiconductor device, comprising:
 a semiconductor substrate having a surface;
 an isolation region in the surface of the semiconductor substrate;
 an active region in the surface of the semiconductor substrate surrounded by the isolation region, the active region having a perimeter and including a main portion having a substantially straight main edge and an expanded portion attached to a part of the main edge of the main portion;
 a gate electrode including a main electrode portion, a contact portion and an inclined portion between the main electrode portion and the contact portion, the main electrode portion and the inclined portion being disposed at least partially over the main portion of the active region, the contact portion being disposed at least partially on the isolation region, the inclined portion having an edge and being inclined relative to the main electrode portion, the edge of the inclined portion of the gate electrode and a boundary between the main portion and the expanded portion of the active region making a first angle that is substantially less than 90°, wherein the expanded portion of the active region increases a distance from the edge of the inclined portion of the gate electrode to the perimeter of the active region.

2. The semiconductor device according to claim 1, wherein the main electrode portion and the inclined portion of the gate electrode have a predetermined width.

3. The semiconductor device according to claim 1, wherein the edge of the inclined portion of the gate electrode extends to at least an adjacent position over the boundary between the expanded portion and the main portion of the active region.

4. The semiconductor device according to claim 1, wherein the main electrode portion of the gate electrode extends in a direction substantially perpendicular to the main edge of the main portion of the active region.

5. The semiconductor device according to claim 1, wherein the first angle is about 45°.

6. The semiconductor device according to claim 1, wherein the expanded portion of the active region comprises an outer edge that is substantially perpendicular to the edge of the inclined portion of the gate electrode.

7. The semiconductor device according to claim 1, wherein the expanded portion of the active region comprises an outer edge that is substantially parallel to the edge of the inclined portion of the gate electrode.

8. The semiconductor device according to claim 1, wherein:
   the main portion of the active region has an additional main edge that is substantially parallel to the main edge; and
   the main electrode portion of the gate electrode extends to at least a position over the additional main edge of the main portion of the active region.

9. The semiconductor device according to claim 1, wherein:
   the main portion of the active region has an additional main edge that is substantially parallel to the main edge;
   the active region further comprises an additional expanded portion attached to a part of the additional main edge of the main portion;
   the gate electrode further comprises an additional inclined portion having an edge, the additional inclined portion is disposed at least partially over the main portion of the active region, the edge of the additional inclined portion and a boundary between the main portion and the additional expanded portion of the active region make a second angle that is substantially less than 90°; and
   the additional expanded portion of the active region increases a distance from the edge of the additional inclined portion of the gate electrode to the perimeter of the active region.

10. A method of forming a semiconductor device which provides increased driving capability, comprising the steps of:
   forming an active region surrounded by an isolation region in a surface of a semiconductor substrate, the active region having a perimeter and including a main portion having a substantially straight main edge and an expanded portion attached to a part of the main edge of the main portion; and
   forming a gate electrode including a main electrode portion, a contact portion and an inclined portion between the main electrode portion and the contact portion, the main electrode portion and the inclined portion being disposed at least partially over the main portion of the active region, the contact portion being disposed at least partially over the isolation region, the inclined portion having an edge and being inclined relative to the main electrode portion, the edge of the inclined portion of the gate electrode and a boundary between the main portion and the expanded portion of the active region making a first angle that is substantially less than 90°,
   wherein the expanded portion of the active region increases a distance from the edge of the inclined portion of the gate electrode to the perimeter of the active region.

11. A semiconductor device comprising:
   a semiconductor substrate having a surface;
   an active region having a perimeter formed in the surface of the semiconductor substrate, the active region comprising a main portion having a substantially straight main edge and an expanded portion attached to a part of the main edge of the main portion; and
   a gate electrode comprising an inclined portion having an edge, the inclined portion being disposed at least partially over the main portion of the active region, the edge of the inclined portion and a boundary between the main portion and the expanded portion of the active region making a first angle that is substantially less than 90°,
   wherein the expanded portion of the active region increases a distance from the edge of the inclined portion of the gate electrode to the perimeter of the active region.

12. The semiconductor device according to claim 11, wherein the inclined portion of the gate electrode has a predetermined width.

13. The semiconductor device according to claim 11, wherein the edge of the inclined portion of the gate electrode extends to at least an adjacent position over the boundary between the expanded portion and the main portion of the active region.

14. The semiconductor device according to claim 11, wherein the first angle is about 45°.

15. The semiconductor device according to claim 11, wherein the expanded portion of the active region includes an outer edge that is substantially perpendicular to the edge of the inclined portion of the gate electrode.

16. The semiconductor device according to claim 11, wherein the expanded portion of the active region includes an outer edge that is substantially parallel to the edge of the inclined portion of the gate electrode.

17. The semiconductor device according to claim 11, wherein:
   the inclined portion of the gate electrode also has an opposite edge;
   the main portion of the active region also has an additional main edge that is substantially parallel to the main edge;
   the active region further includes an additional expanded portion attached to a part of the additional main edge;
   the opposite edge of the inclined portion of the gate electrode and a boundary between the main portion and the additional expanded portion of the active region make a second angle that is substantially smaller than 90°; and
   the additional expanded portion of the active region increases a distance from the opposite edge of the inclined portion of the gate electrode to the perimeter of the active region.

18. The semiconductor device according to claim 11, wherein:

the main portion of the active region also has an additional main edge that is substantially parallel to the main edge;

the active region further comprises an additional expanded portion attached to a part of the additional main edge of the main portion;

the gate electrode further comprises an additional inclined portion and a main electrode portion between the inclined portion and the additional inclined portion, the additional inclined portion and the main electrode portion of the gate electrode are disposed at least partially over the main portion of the active region, the inclined portion and the additional inclined portion are inclined relative to the main portion, an edge of the additional inclined portion and a boundary between the main portion and the additional expanded portion of the active region make a second angle that is substantially less than 90°; and the additional expanded portion of the active region increases a distance from the edge of the additional inclined portion of the gate electrode to the perimeter of the active region.

19. A method of forming a semiconductor device which provides increased driving capability, comprising the steps of:

forming an active region having a perimeter in a surface of a semiconductor substrate, the active region comprising a main portion having a substantially straight main edge and an expanded portion attached to a part of the main edge of the main portion;

forming a gate electrode comprising an inclined portion having an edge, the inclined portion disposed at least partially over the main portion of the active region, the edge of the inclined portion and a boundary between the main portion and the expanded portion of the active region making a first angle that is substantially less than 90°;

wherein the expanded portion of the active region increases a distance from the edge of the inclined portion of the gate electrode to the perimeter of the active region.

20. A semiconductor device comprising:

a semiconductor substrate having a surface;

an active region formed in the surface of the semiconductor substrate, the active region comprising a main portion having a substantially straight main edge and an expanded portion attached to a part of the main edge of the main portion; and a gate electrode comprising an inclined portion having an edge, the inclined portion disposed at least partially over the main portion of the active region, the edge of the inclined portion of the gate electrode and the boundary between the main portion and the expanded portion of the active region making a first angle that is substantially less than 90°;

wherein the active region comprises a channel region below the inclined portion of the gate electrode and a diffusion region on a side of the edge of the inclined portion of the gate electrode, and wherein the diffusion region expands to the expanded portion of the active region so that a resistance of the diffusion region to the channel region is substantially decreased.

21. A method of forming a semiconductor device which provides increased driving capability, comprising the steps of:

forming an active region in a surface of a semiconductor substrate, the active region comprising a main portion having a substantially straight main edge and an expanded portion attached to a part of the main edge of the main portion;

forming a gate electrode comprising an inclined portion having an edge, the inclined portion disposed at least partially over the main portion of the active region so that a channel region is formed in the active region below the inclined portion of the gate electrode, the edge of the inclined portion of the gate electrode and the boundary between the main portion and the expanded portion of the active region making a first angle that is substantially less than 90°; and forming a diffusion region in the active region on a side of the edge of the inclined portion of the gate electrode, the diffusion region expanding to the expanded portion of the active region so that a resistance of the diffusion region to the channel region is substantially decreased.

22. A semiconductor device comprising:

a semiconductor substrate having a surface;

an isolation region in the surface of the semiconductor substrate;

an active region in the surface of the semiconductor substrate surrounded by the isolation region;

a gate electrode including a main electrode portion, a contact portion having a contact area for forming a contact to the gate electrode, and a connecting portion for connecting the contact portion to the main electrode portion, the main electrode portion and the connecting portion being disposed at least partially over the active region, the contact portion being disposed at least partially on the isolation region, the connecting portion being inclined relative to the main electrode portion, wherein the active region includes contact areas for forming contacts to the active region on both sides of the main electrode portion of the gate electrode, the contact areas of the active region are aligned in a first direction with a first space; and one of the contact areas of the active region and the contact area of the gate electrode are aligned in a second direction perpendicular to the first direction with a second space.

23. The semiconductor device according to claim 22, wherein the main electrode portion and the connecting portion of the gate electrode have a predetermined width.

24. The semiconductor device according to claim 22, wherein the main electrode portion of the gate electrode extends to the second direction.

25. The semiconductor device according to claim 22, wherein the active region has a generally rectangular shape having edges substantially aligned in the first and the second direction.

26. The semiconductor device according to claim 22, wherein the second space is equal to the first space.

27. The semiconductor device according to claim 22, wherein the connecting portion of the gate electrode inclines relative to the main electrode portion by about 45°.

28. A semiconductor device comprising:

a semiconductor substrate having a surface;

an isolation region in the surface of the semiconductor substrate;

an active region in the surface of the semiconductor substrate surrounded by the isolation region, the active region having a perimeter and comprising a main portion having a substantially straight main edge and an expanded portion attached to the main edge of the main portion;

a gate electrode including a main electrode portion, a contact portion having a contact area for forming a contact to the gate electrode, and a connecting portion for connecting the contact portion to the main electrode portion, the main electrode portion and the connecting portion being disposed at least partially over the main portion of the active region, the contact portion being disposed at least partially over the isolation region, the connecting portion having an edge, the connecting portion being inclined relative to the main portion, the edge of the connecting portion of the gate electrode and a boundary between the main portion and the expanded portion of the active region making a first angle that is substantially less than 90°, wherein the active region has contact areas for forming contacts to the active region on both sides of the main electrode portion of the gate electrode, the contact areas of the active region are aligned in a first direction with a first space;

one of the contact areas of the active region and the contact area of the gate electrode are aligned in a second direction perpendicular to the first direction with a second space; and the expanded portion of the active region increases a distance from the edge of the inclined portion of the gate electrode to a perimeter of the active region.

29. The semiconductor device according to claim 28, wherein the main edge of the main portion of the active region is substantially aligned in the first direction.

30. The semiconductor device according to claim 28, wherein the main electrode portion of the gate electrode extends to the second direction.

31. The semiconductor device according to claim 28, wherein the first angle is about 45°.

32. The semiconductor device according to claim 28, wherein the expanded portion of the active region comprises an outer edge substantially perpendicular to the edge of the connecting portion of the gate electrode.

33. The semiconductor device according to claim 28, wherein the expanded portion of the active region comprises an outer edge substantially parallel to the edge of the connecting portion of the gate electrode.

34. The semiconductor device according to claim 28, wherein the main portion of the active region has a generally rectangular shape having edges substantially aligned in the first and the second direction.

35. A method of designing the layout of a semiconductor device, comprising the steps of:

placing an active region surrounded by an isolation region; and placing a gate electrode including a main electrode portion, a contact portion having a contact area for forming a contact to the gate electrode, and a connecting portion for connecting the contact portion to the main electrode portion, the main electrode portion and the connecting portion being disposed at least partially over the active region, the contact portion being disposed at least partially over the isolation region, the connecting portion being inclined relative to the main electrode portion, wherein the active region has contact areas for forming contacts to the active region on both sides of the main electrode portion of the gate electrode, the contact areas of the active region are aligned in a first direction with a first space; and one of the contact areas of the active region and the contact area of the gate electrode are aligned in a second direction perpendicular to the first direction with a second space.

36. A semiconductor integrated circuit comprising an array of basic cells arranged in a first and a second direction that are perpendicular with each other, each of the basic cells comprising:

a semiconductor substrate having a surface;

an isolation region in the surface of the semiconductor substrate;

an active region in the surface of the semiconductor substrate surrounded by the isolation region;

a gate electrode including a main electrode portion, a contact portion having a contact area for forming a contact to the gate electrode, and a connecting portion for connecting the contact portion to the main electrode portion, the main electrode portion and the connecting portion being disposed at least partially over the active region, the contact portion being disposed at least partially over the isolation region, the connecting portion being inclined relative to the main electrode portion, wherein the active region has contact areas for forming contacts to the active region on both sides of the main electrode portion of the gate electrode, the contact areas of the active region are aligned in the first direction with a first space; and one of the contact areas of the active region and the contact area of the gate electrode are aligned in the second direction with a second space.

* * * * *